(12) United States Patent
Takahashi et al.

(10) Patent No.: US 7,531,757 B2
(45) Date of Patent: May 12, 2009

(54) IC CARD AND SEMICONDUCTOR INTEGRATED CIRCUIT DEVICE PACKAGE

(75) Inventors: Takuya Takahashi, Tokyo (JP); Kazuhiro Yamamoto, Naka-gun (JP); Minoru Ohara, Ome (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/037,713

(22) Filed: Feb. 26, 2008

(65) Prior Publication Data

US 2008/0158835 A1 Jul. 3, 2008

Related U.S. Application Data

(63) Continuation of application No. 10/442,959, filed on May 22, 2003, now Pat. No. 7,351,920.

(30) Foreign Application Priority Data

May 22, 2002 (JP) ............................... 2002-147914

(51) Int. Cl.
*H01L 23/28* (2006.01)
(52) U.S. Cl. .................... 174/521; 361/737; 257/679
(58) Field of Classification Search ................ 361/736, 361/737, 797; 174/521, 527; 257/679
See application file for complete search history.

(56) References Cited

U.S. PATENT DOCUMENTS

| 4,943,464 | A | 7/1990 | Gloton et al. | |
|---|---|---|---|---|
| 5,574,628 | A | 11/1996 | Persia et al. | |
| 6,031,724 | A | 2/2000 | Takahashi | |
| 6,145,023 | A | 11/2000 | Iwasaki | |
| 6,404,647 | B1* | 6/2002 | Minne' | 361/760 |
| 6,663,007 | B1* | 12/2003 | Sun et al. | 235/487 |
| 6,709,889 | B2 | 3/2004 | Gore et al. | |
| 2003/0198028 | A1* | 10/2003 | Nakanishi et al. | 361/737 |

FOREIGN PATENT DOCUMENTS

| JP | 49-72160 | 6/1974 |
|---|---|---|
| JP | 61-15173 | 1/1986 |
| JP | 61-128756 | 8/1986 |
| JP | 61-266299 | 11/1986 |
| JP | 62-55196 | 3/1987 |
| JP | 62-157276 | 10/1987 |

(Continued)

OTHER PUBLICATIONS

Abstract for JP 1-128884; Published date May 22, 1989.

*Primary Examiner*—Hung V Ngo
(74) *Attorney, Agent, or Firm*—Oblon, Spivak, McClelland, Maier & Neustadt, P.C.

(57) ABSTRACT

An IC card includes a semiconductor integrated circuit device package having one surface and another surface opposite to the one surface, card terminals on the one surface of the package, and a base card which includes a concave portion attached to the other surface of the package. The package includes a wiring board, a semiconductor integrated circuit chip on the wiring board, and an insulating resin coated over the semiconductor integrated circuit chip. The package is a rectangular parallelepiped package. The insulating resin is exposed to the other surface of the package. The insulating resin and the wiring board are exposed to four surfaces of the package except for the one surface and the other surface.

7 Claims, 35 Drawing Sheets

FOREIGN PATENT DOCUMENTS

| | | |
|---|---|---|
| JP | 63-7981 | 1/1988 |
| JP | 63-288793 | 11/1988 |
| JP | 64-13379 | 1/1989 |
| JP | 64-40397 | 2/1989 |
| JP | 1-128884 | 5/1989 |
| JP | 1-303780 | 12/1989 |
| JP | 2-198897 | 8/1990 |
| JP | 3-55296 | 3/1991 |
| JP | 4-2683 | 1/1992 |
| JP | 6-15992 | 1/1994 |
| JP | 9-120440 | 5/1997 |
| JP | 11-53503 | 2/1999 |
| JP | 2001-209773 | 8/2001 |
| JP | 2001-244399 | 9/2001 |
| JP | 2001-274308 | 10/2001 |
| JP | 2002-16189 | 1/2002 |
| JP | 2002-16193 | 1/2002 |

\* cited by examiner

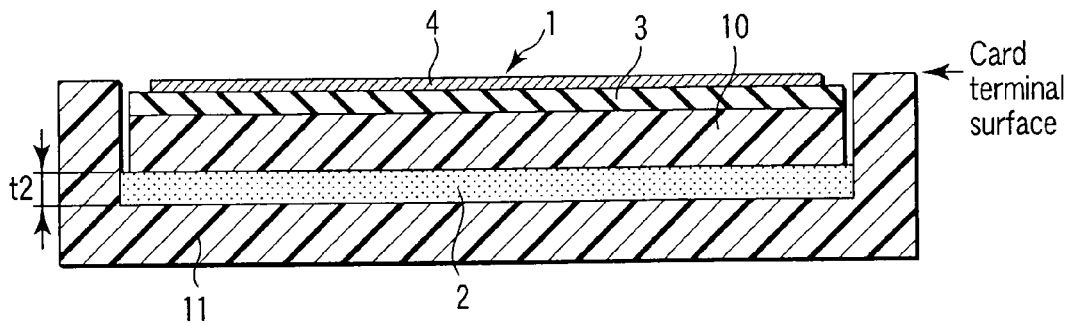
F I G. 19A
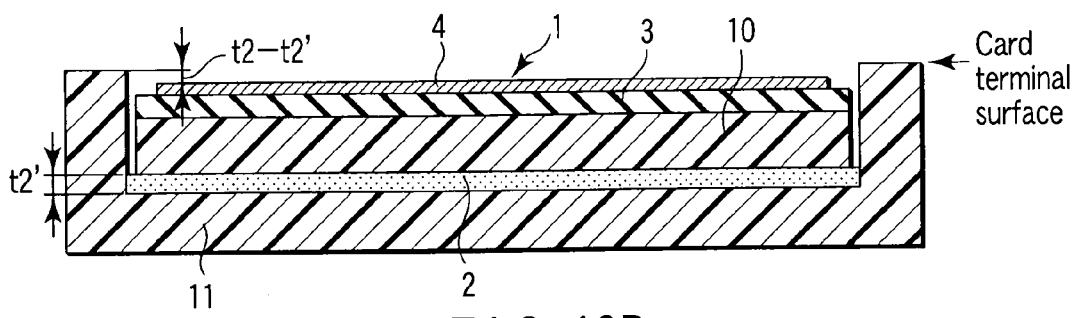
F I G. 19B
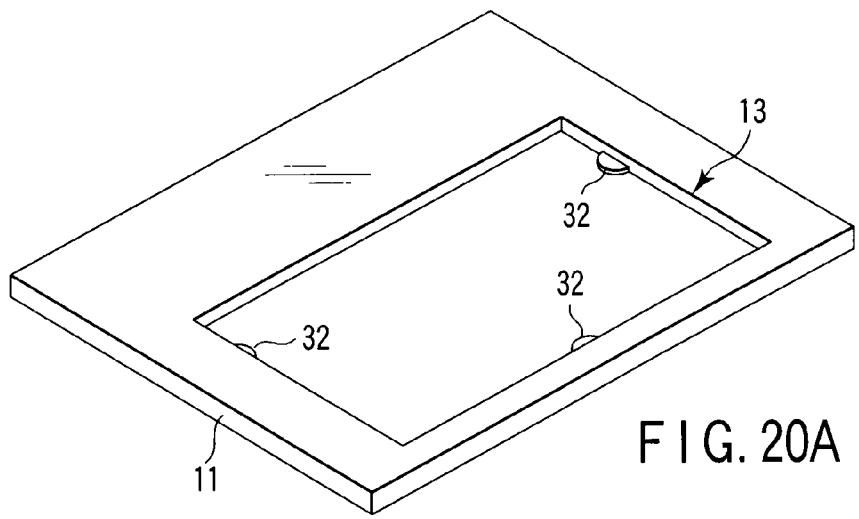
F I G. 20A
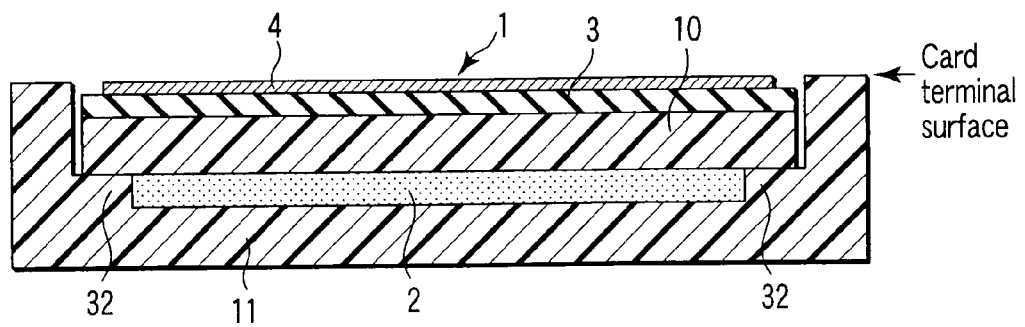
F I G. 20B

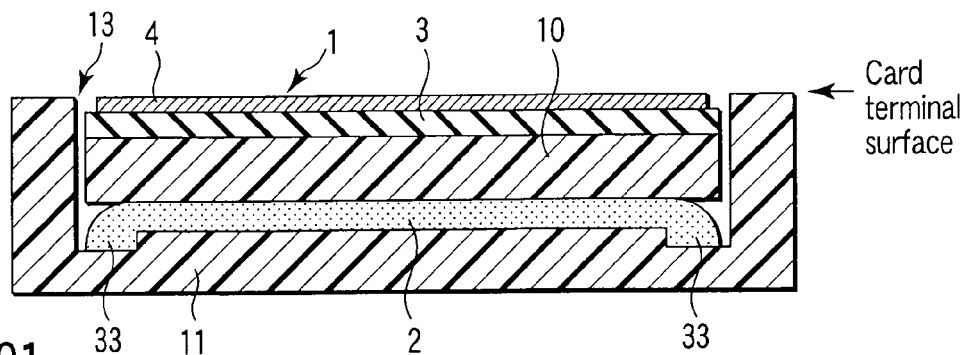
F I G. 21
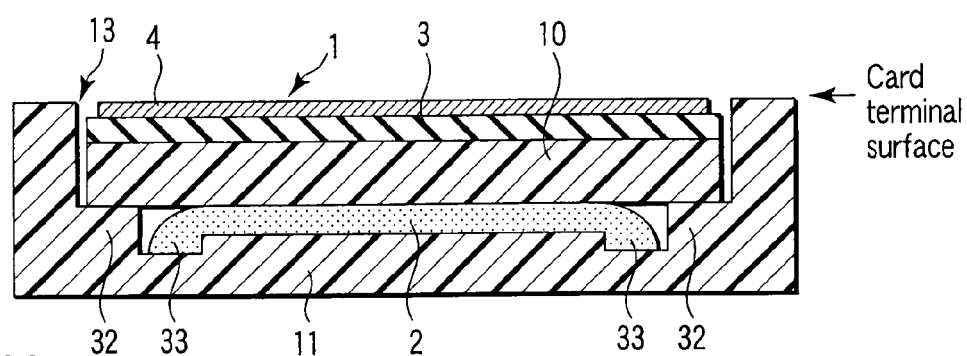
F I G. 22
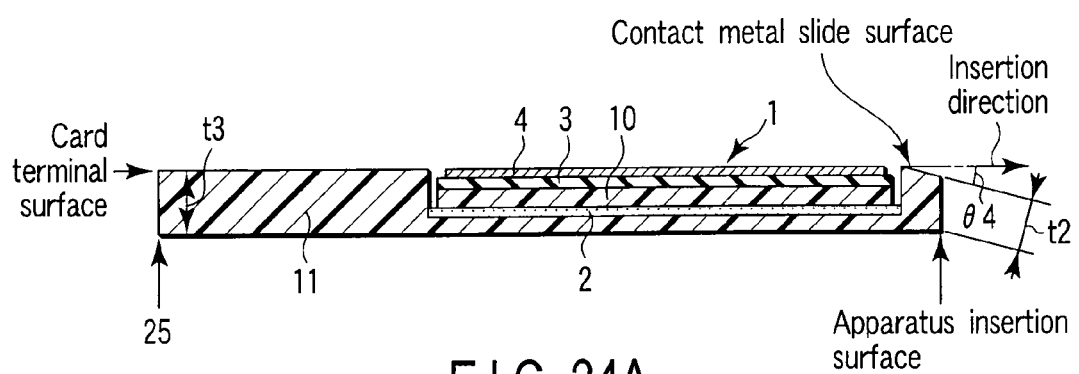
F I G. 24A
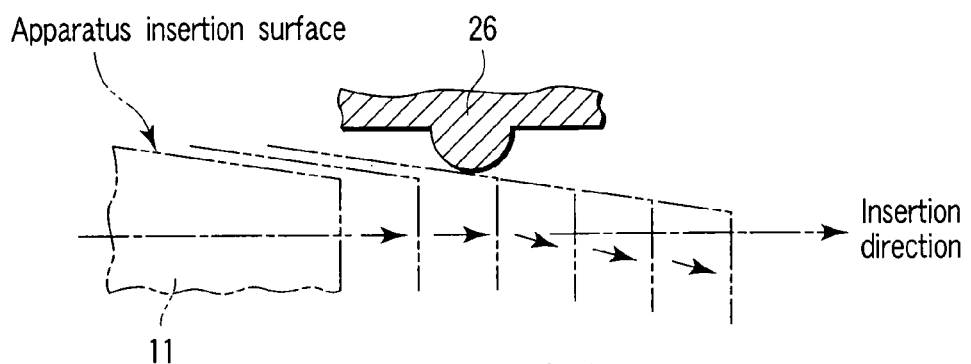
F I G. 24B

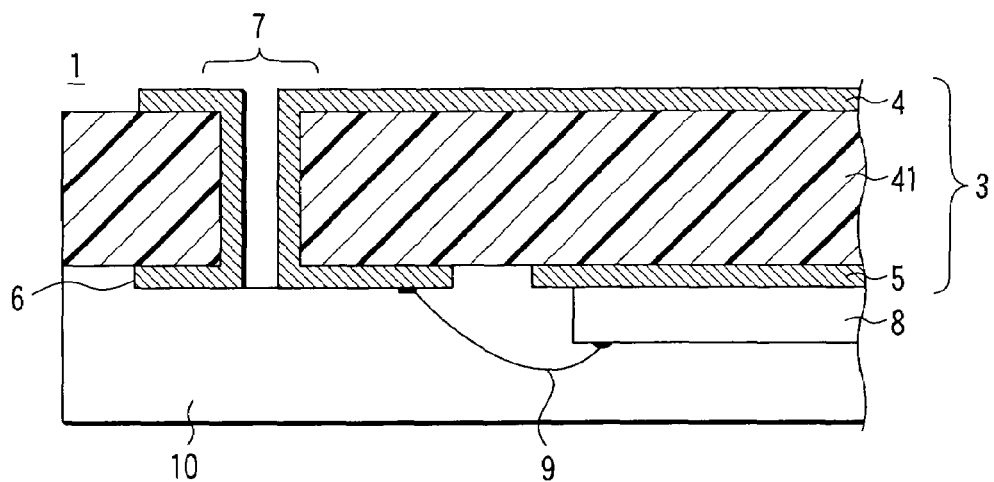
F I G. 27A
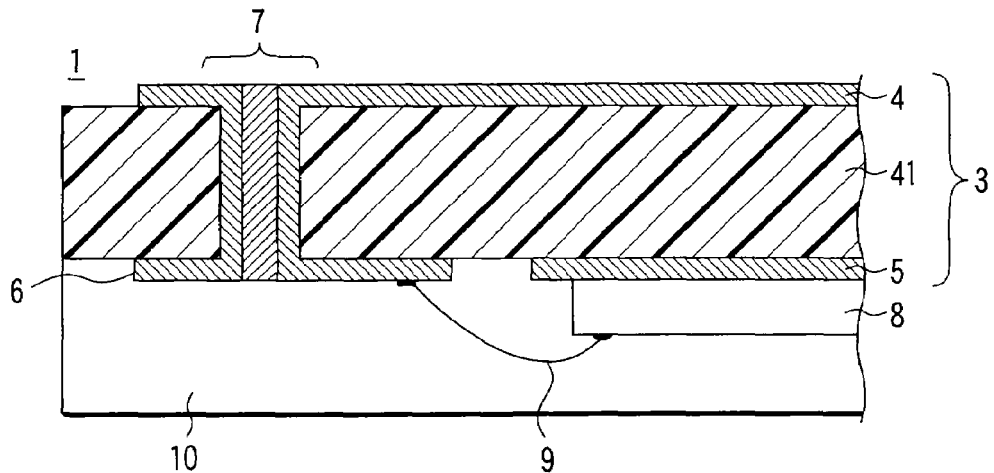
F I G. 27B
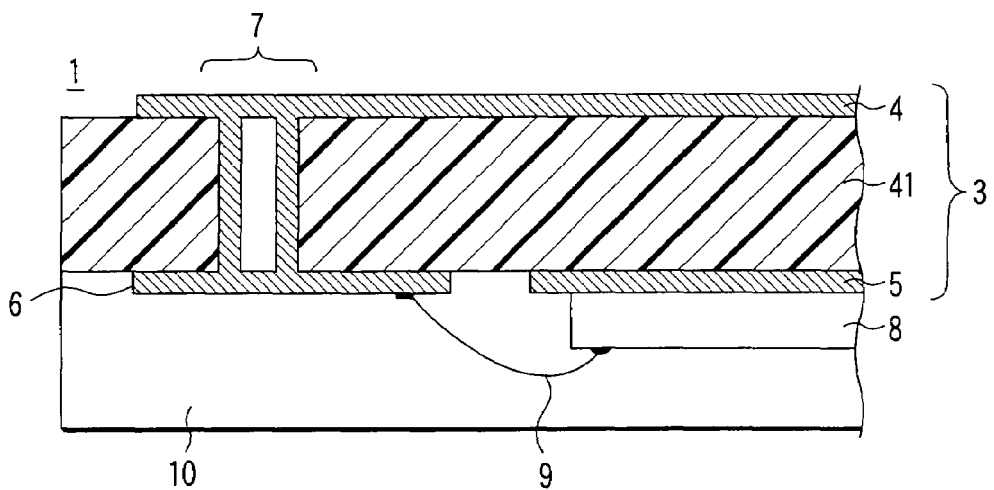
F I G. 27C

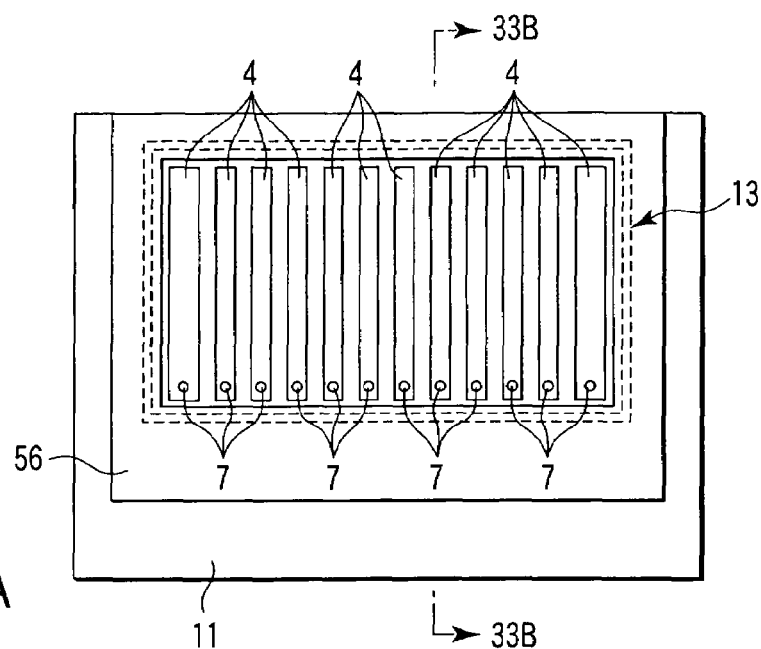
FIG. 33A
FIG. 33B
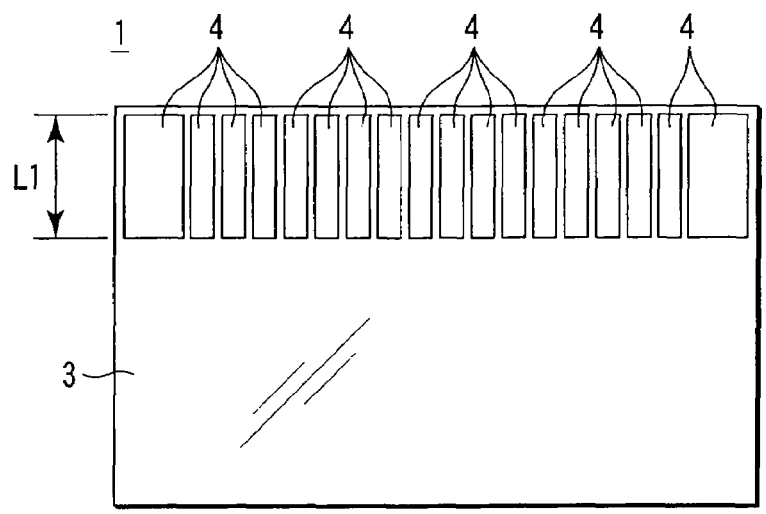
FIG. 34

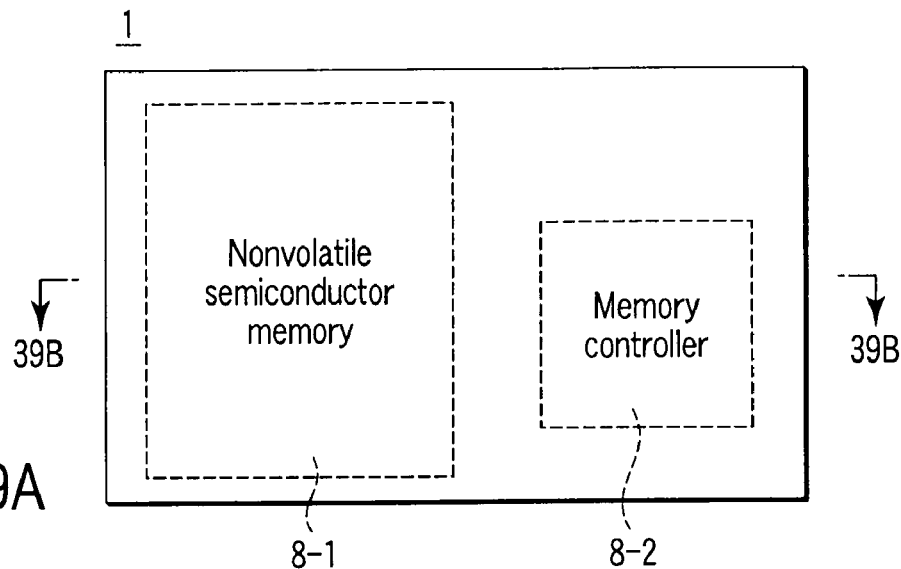
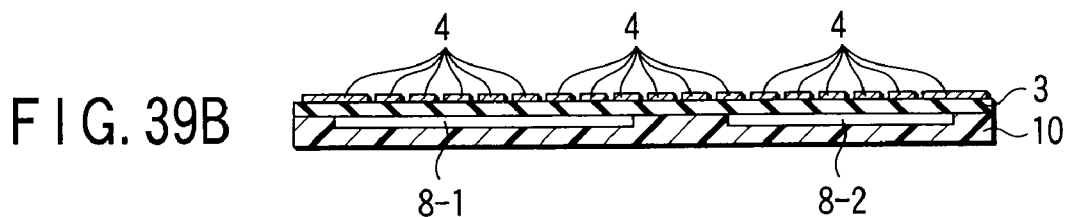
FIG. 39A
FIG. 39B
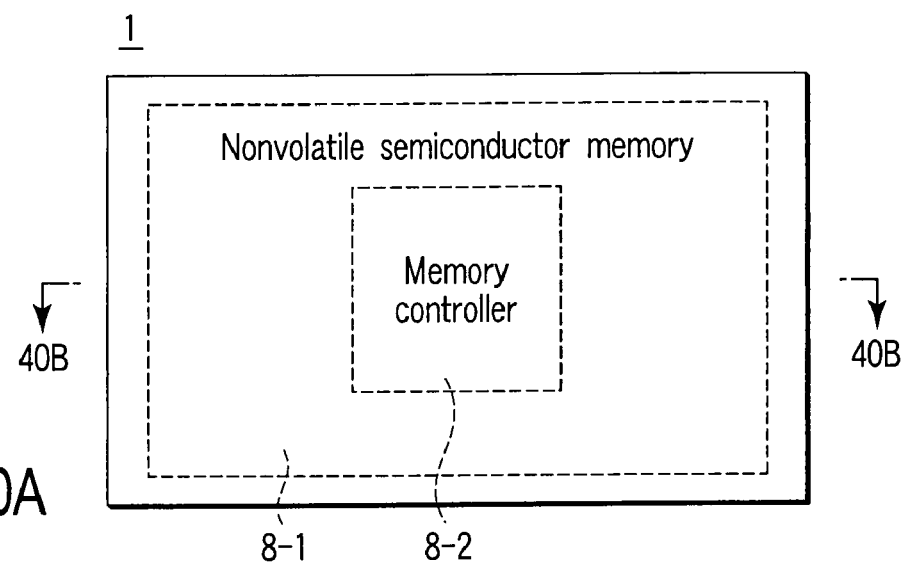
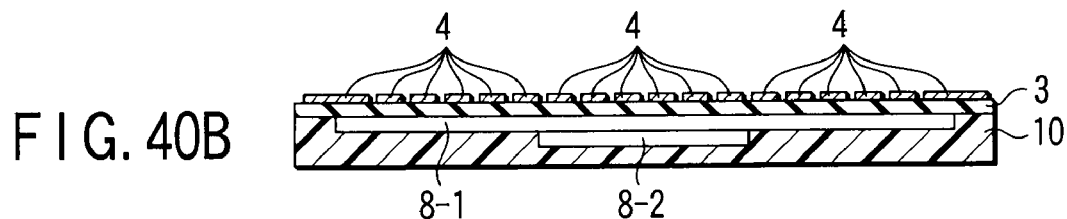
FIG. 40A
FIG. 40B

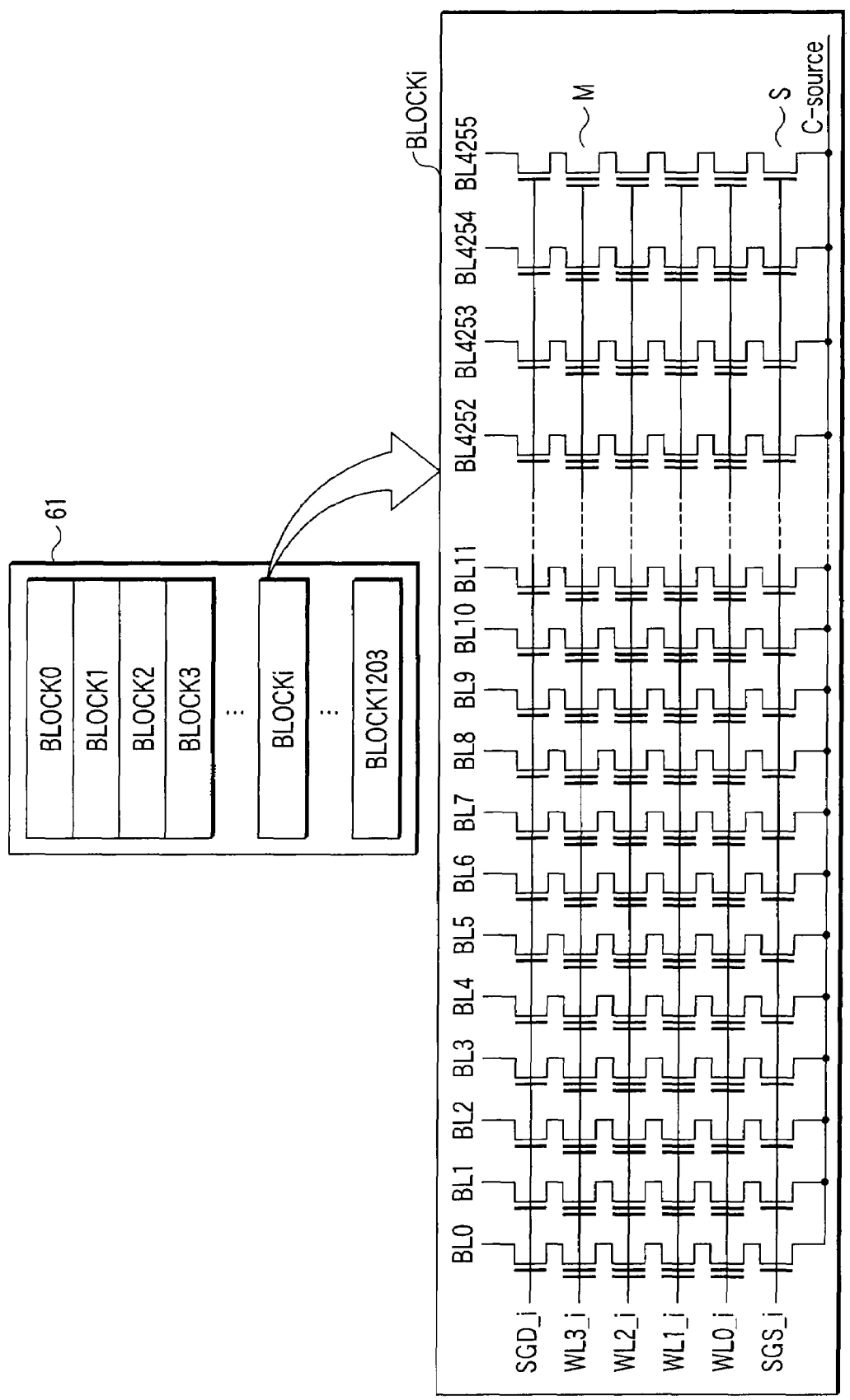
F I G. 42

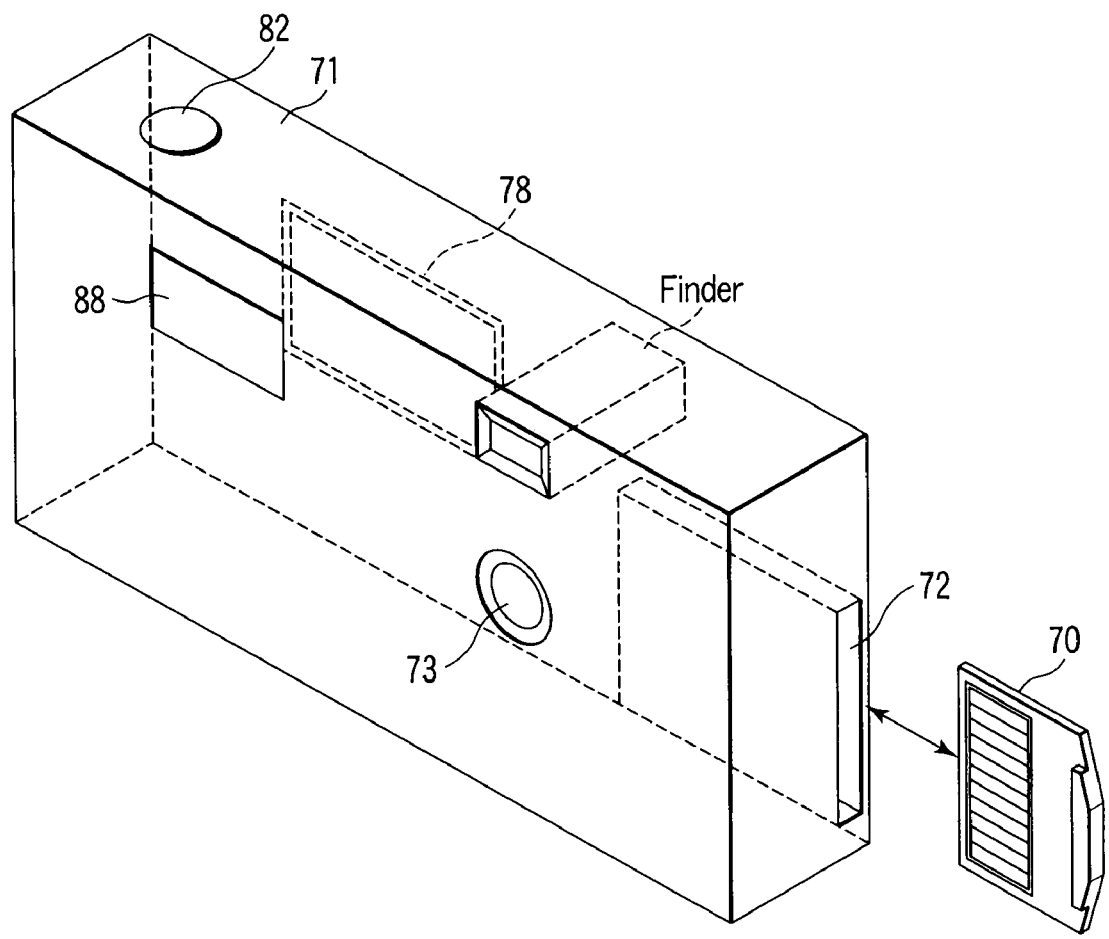
F I G. 43

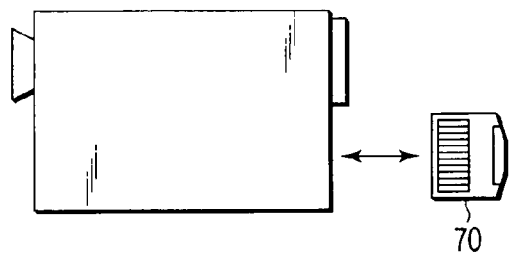
F I G. 45A
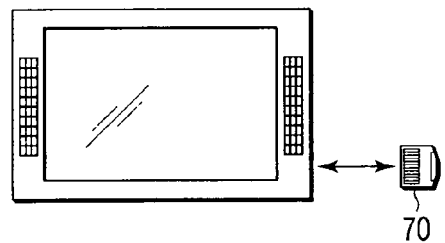
F I G. 45B
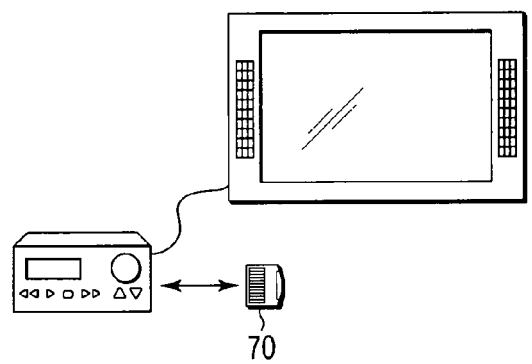
F I G. 45C
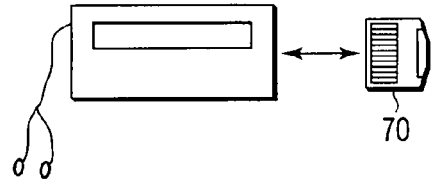
F I G. 45D
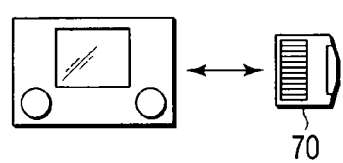
F I G. 45E
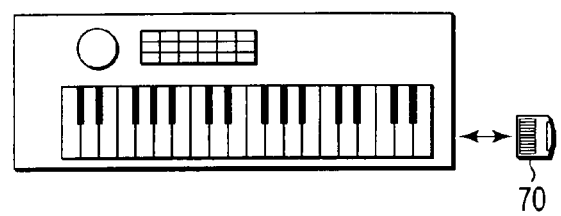
F I G. 45F

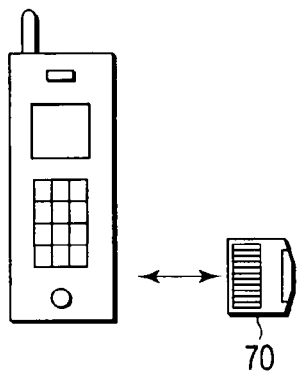
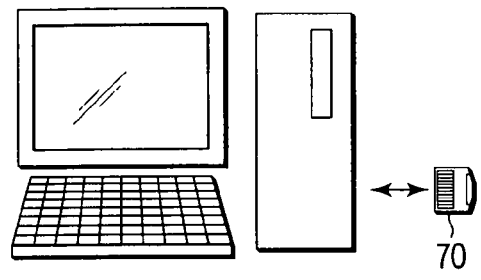
FIG. 45G                    FIG. 45H
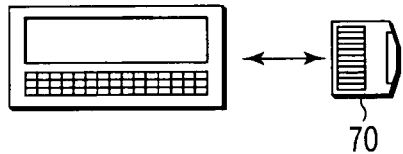
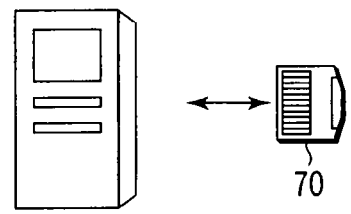
FIG. 45I                    FIG. 45J
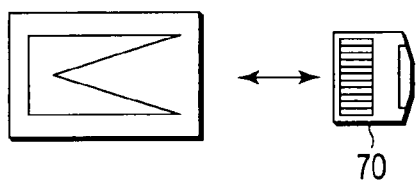
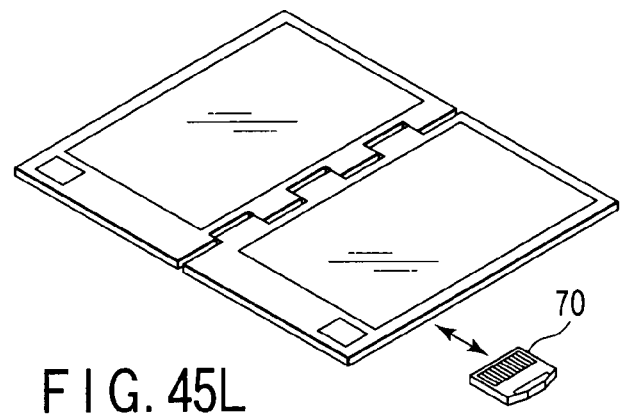
FIG. 45K                    FIG. 45L

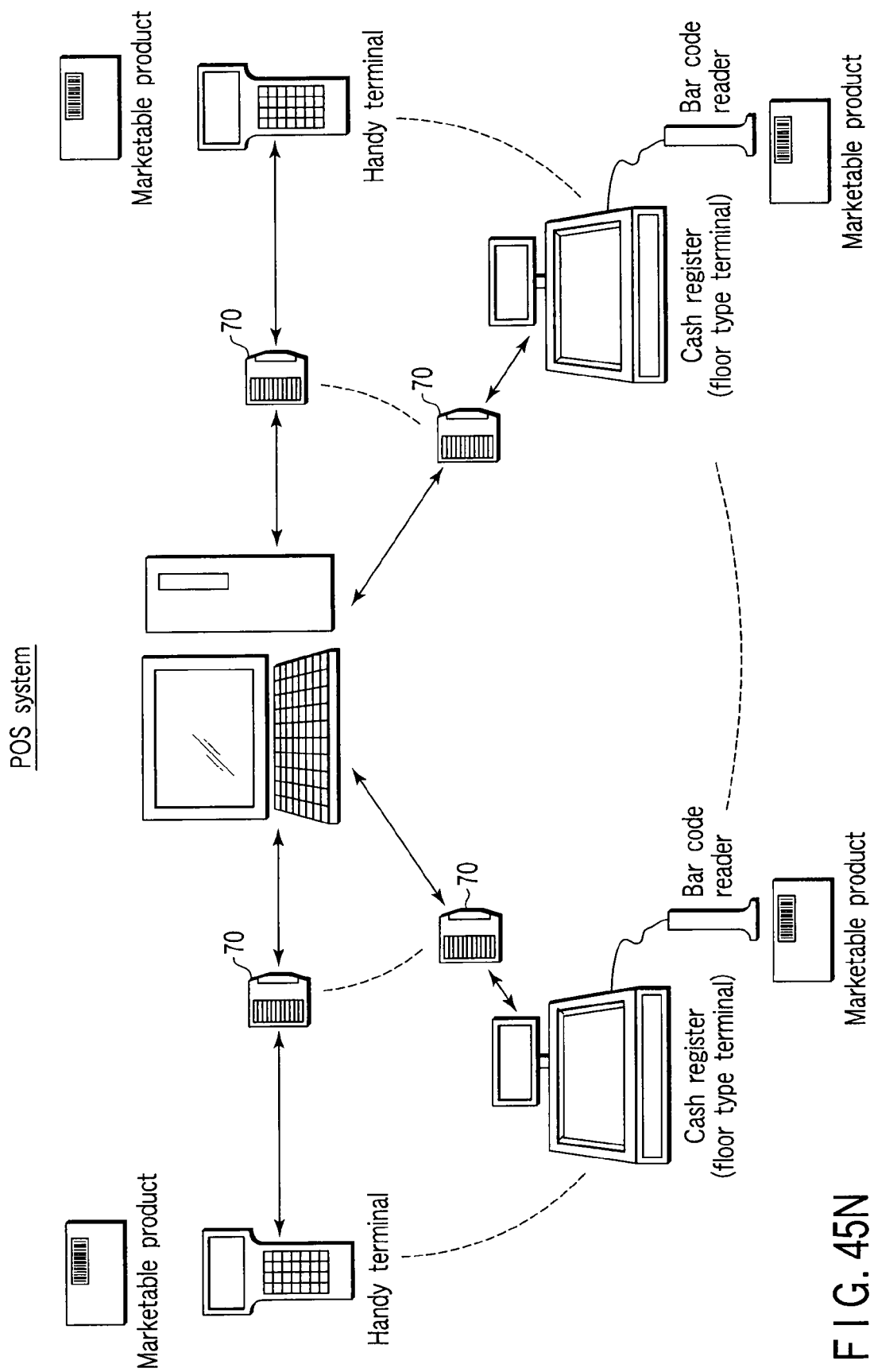
F I G. 45N

IC CARD AND SEMICONDUCTOR INTEGRATED CIRCUIT DEVICE PACKAGE

CROSS-REFERENCE TO RELATED APPLICATIONS

This application is a continuation of U.S. application Ser. No. 10/442,959, filed on May 22, 2003, which claims priority to Japanese Patent Application No. 2002-147914, filed May 22, 2002, the entire contents of which are incorporated herein by reference.

BACKGROUND OF THE INVENTION

1. Field of the Invention

The present invention relates to an IC card, a semiconductor integrated circuit device package for use in the IC card, and an electronic device in which the IC card is used.

2. Description of the Related Art

As one of structures of an IC card, there is a structure in which a chip-on-board (COB) type semiconductor integrated circuit device package (hereinafter referred to as the COB type package) is contained in a cavity disposed in a base card in a so-called cavity down state. A typical example of this structure is shown in FIGS. 1A and 1B. FIG. 1A is a sectional view showing the IC card 25 according to the typical example, and FIG. 1B is an exploded sectional view. As shown in FIGS. 1A and 1B, for a COB type package 101, a semiconductor integrated circuit chip 103 is mounted on a printed board 102 in a bare state, and the chip 103 is coated with a resin 104. Therefore, in the COB type package 101, fringes 105 exist between an outer peripheral portion of the printed board 102 and the resin 104. FIG. 2 shows an appearance of the COB type package 101.

A cavity 112 for containing the COB type package 101 is disposed in a base card 111. Paste edges 113 are disposed in the periphery of the cavity 112, and the fringes 105 of the COB type package 101 are bonded to the paste edges 113. Accordingly, particularly a portion of the resin 104 of the COB type package 101 is contained in the cavity 112 in a so-called cavity down state.

BRIEF SUMMARY OF THE INVENTION

An IC card according to a preferred embodiment comprises: a semiconductor integrated circuit device package having one surface and another surface opposite to the one surface, which includes a wiring board, a semiconductor integrated circuit chip on the wiring board, and an insulating resin coated over the semiconductor integrated circuit chip to form the other surface of the integrated circuit device package; card terminals on the one surface of the semiconductor integrated circuit device package, the card terminals being electrically connected to the semiconductor integrated circuit chip, the card terminals being rectangular and extending in parallel to each other, an outermost of the card terminals being wider than the other terminals; and a base card, including a concave portion, attached to the other surface of the semiconductor integrated circuit device package, the base card including a card terminal surface and an opposite surface, wherein side walls of the semiconductor integrated circuit device package are spaced apart from the base card, and the card terminal surface of the base card includes a rib projecting from the card terminal surface on an end of the card terminal surface opposite to the apparatus insertion surface.

A semiconductor integrated circuit device package according to a second aspect of the present invention comprises: at least one semiconductor integrated circuit chip; a rectangular parallelepiped package in which at least one semiconductor integrated circuit chip is contained; and a plurality of card terminals which are disposed in one surface of the rectangular parallelepiped package and which are electrically connected to at least one semiconductor integrated circuit chip and which can re-contact terminals of an electronic device.

An electronic device according to a third aspect of the present invention comprises: a card interface; a card slot connected to the card interface; and an IC card electrically connected to the card slot, this IC card including: a base card having a concave portion; and a semiconductor integrated circuit device package which includes one surface and the other surface disposed opposite to the one surface and in which a plurality of card terminals recontactable with respect to terminals of an electronic device are disposed on the one surface and the other surface is attached to a bottom of the concave portion of the base card.

BRIEF DESCRIPTION OF THE SEVERAL VIEWS OF THE DRAWING

FIGS. 19A and 19B are sectional views showing the background of a sixth structure;

FIG. 20A is a perspective view showing one example of the sixth structure of the IC card according to the embodiment of the present invention;

FIG. 20B is a sectional view showing the typical effect by the sixth structure;

FIG. 21 is a sectional view showing one example of a seventh structure of the IC card according to the embodiment of the present invention;

FIG. 22 is a sectional view showing a modification example of the seventh structure of the IC card according to the embodiment of the present invention;

FIG. 24A is a plan view showing one example of a ninth structure of the IC card according to the embodiment of the present invention;

FIG. 24B is a diagram showing a typical effect by the ninth structure;

FIG. 27A is a sectional view showing a first example of a connection portion;

FIG. 27B is a sectional view showing a second example of the connection portion;

FIG. 27C is a sectional view showing a third example of the connection portion;

FIG. 33A is a plan view showing the IC card according to a fifth modification example;

FIG. 33B is a sectional view taken along line 33B-33B in FIG. 33A;

FIG. 34 is a plan view showing the semiconductor integrated circuit device package according to a sixth modification example;

FIG. 39A is a plan view showing the semiconductor integrated circuit device package according to an eleventh modification example;

FIG. 39B is a sectional view taken along line 39B-39B in FIG. 39A;

FIG. 40A is a plan view showing the semiconductor integrated circuit device package according to a twelfth modification example;

FIG. 40B is a sectional view taken along line 40B-40B in FIG. 40A;

FIG. 42 is a diagram showing one example of a memory cell array shown in FIG. 41;

FIG. 43 is a perspective view showing one example of an electronic device in which the IC card according to the embodiment of the present invention is used;

DETAILED DESCRIPTION OF THE INVENTION

Figure 1A:
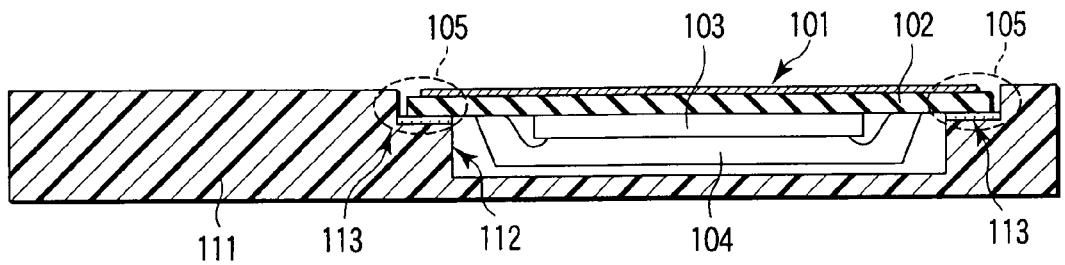
FIG. 1A is a sectional view showing an IC card according to a conventional example.

One embodiment of the present invention will be described hereinafter with reference to the drawings. In the description, portions common to all the drawings are denoted with common reference numerals.

Figure 3A:
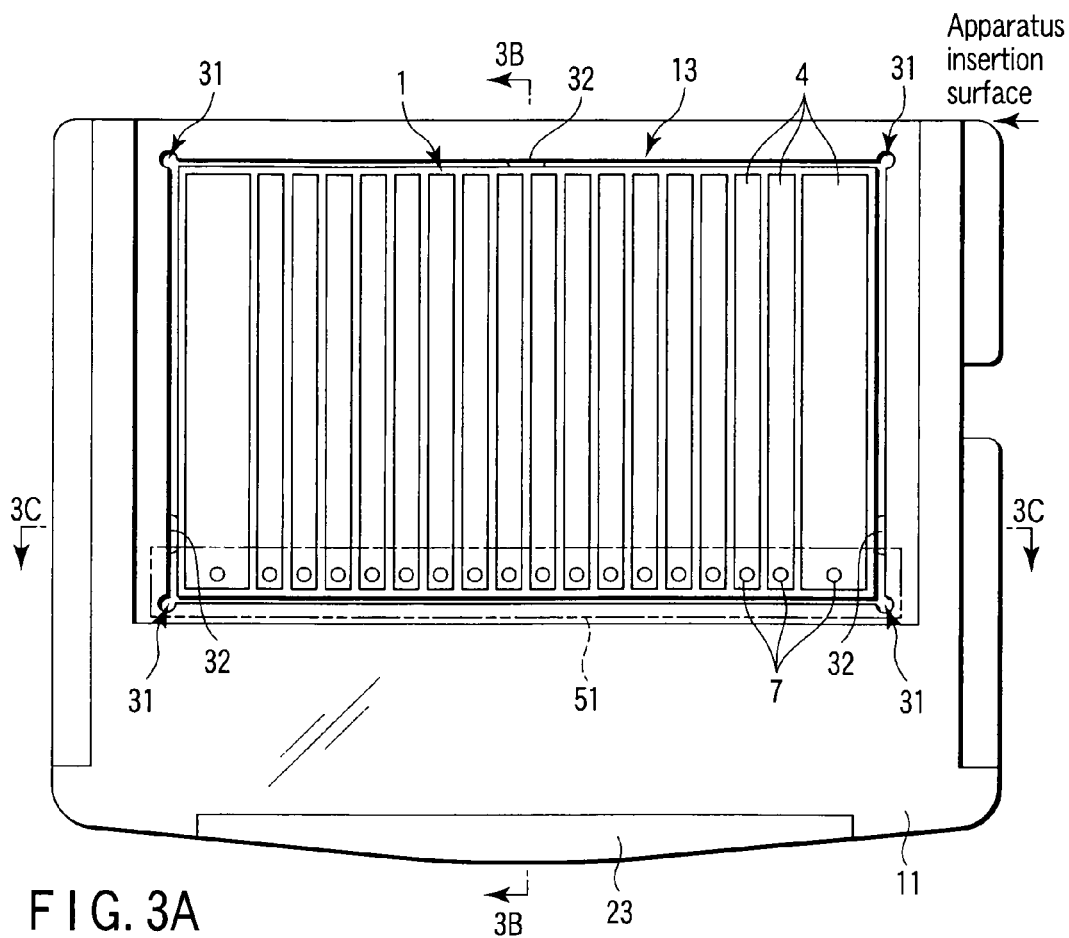
FIG. 3A is a plan view showing the IC card according to one embodiment of the present invention.
Figure 3B:
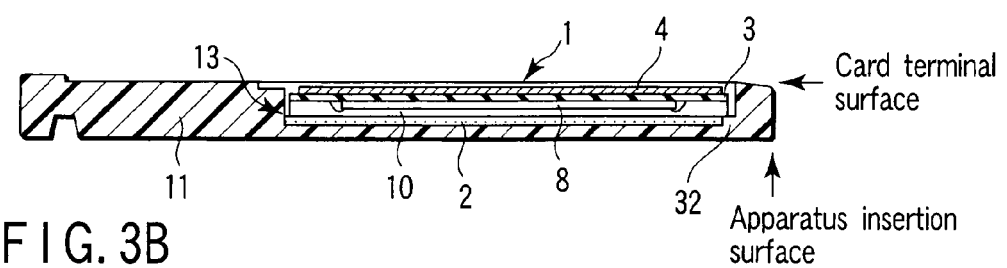
FIG. 3B is a sectional view taken along line 3B-3B in FIG. 3A.
Figure 3C:
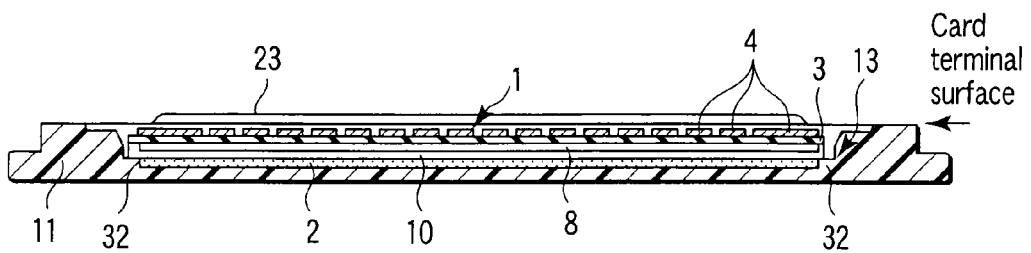
FIG. 3C is a sectional view taken along line 3C-3C in FIG. 3A.

FIG. 3A is a plan view showing an IC card according to the embodiment of the present invention, FIG. 3B is a sectional view taken along line 3B-3B in FIG. 3A, and FIG. 3C is a sectional view taken along line 3C-3C in FIG. 3A.

Figure 4A:
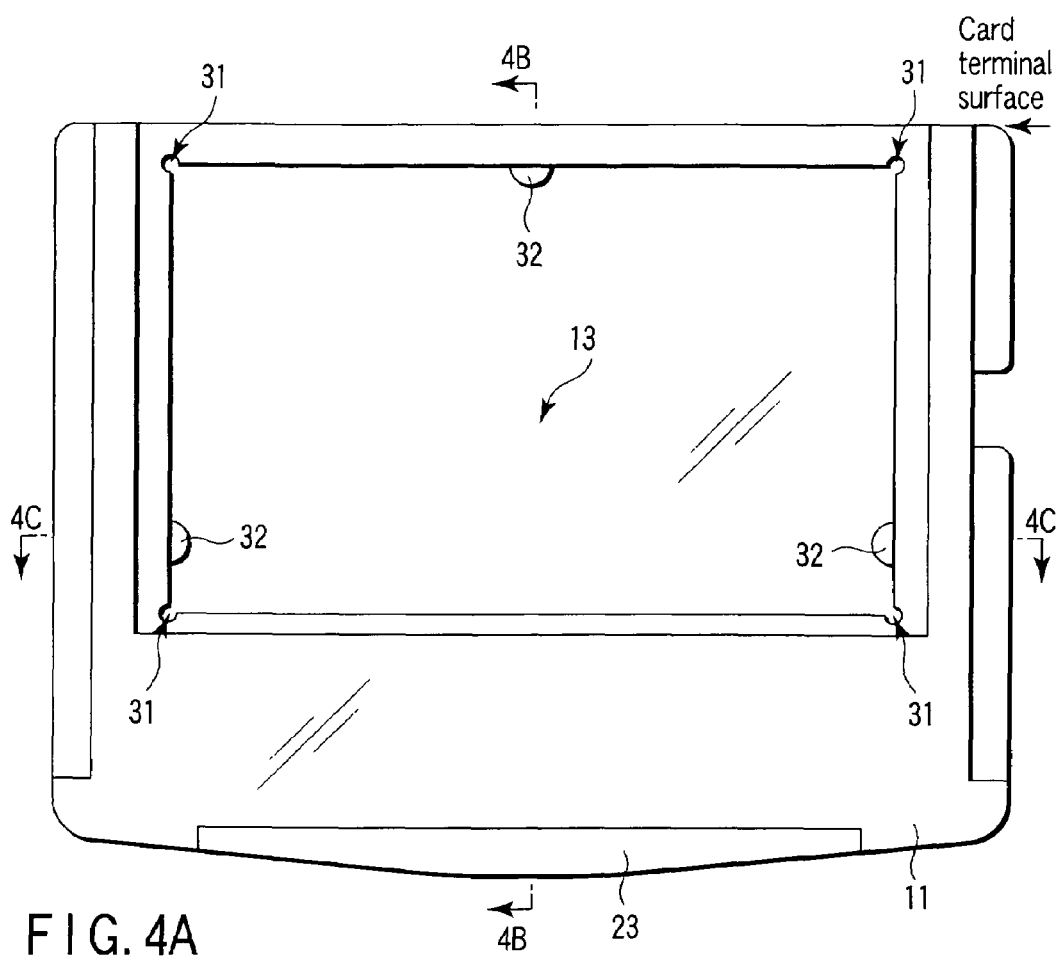
FIG. 4A is a plan view showing one example of a base card for use in the IC card according to the embodiment of the present invention.
Figure 4B:
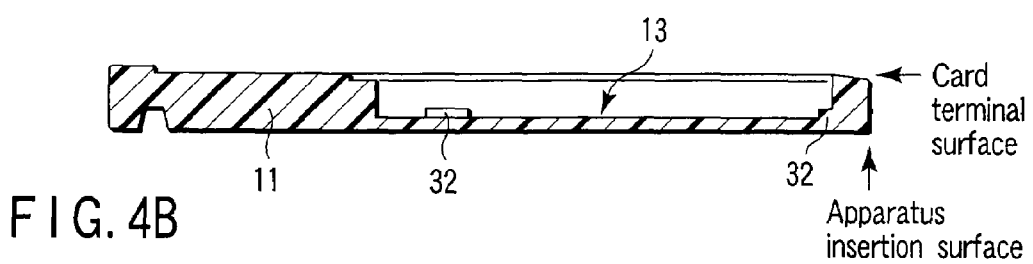
FIG. 4B is a sectional view taken along line 4B-4B in FIG. 4A.
Figure 4C:
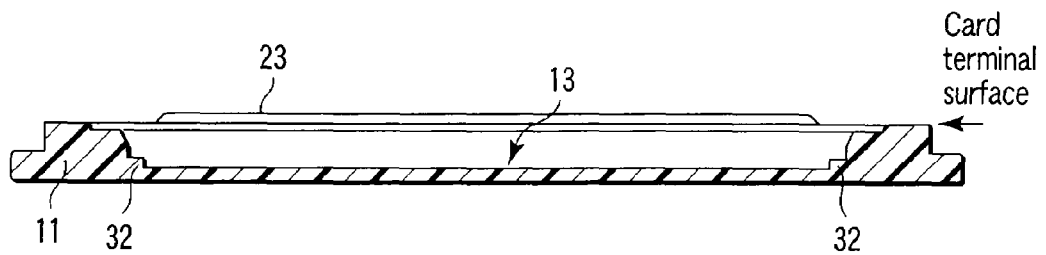
FIG. 4C is a sectional view taken along line 4C-4C in FIG. 4A.

FIG. 4A is a plan view showing one example of a base card for use in the IC card according to the embodiment of the present invention, FIG. 4B is a sectional view taken along line 4B-4B in FIG. 4A, and FIG. 4C is a sectional view taken along line 4C-4C in FIG. 4A.

As shown in FIGS. 3A to 3C, and 4A to 4C, a concave portion 13 is disposed in a base card 11. A semiconductor integrated circuit device package 1 is attached to a bottom of the concave portion 13. This example of attachment is bonding, for example, by an adhesive 2, or an adhesive tape. The package 1 is attached to the concave portion 13, for example, in an state in which it is difficult to attach/detach the package. This prevents, for example, an unforeseen peel in a market, or unnecessary detachment. However, for example, in consideration of change or attachment of the semiconductor integrated circuit device package 1 in the market, it is also possible to attach the semiconductor integrated circuit device package 1 to the concave portion 13, for example, in an attachable/detachable state.

Figure 1B:
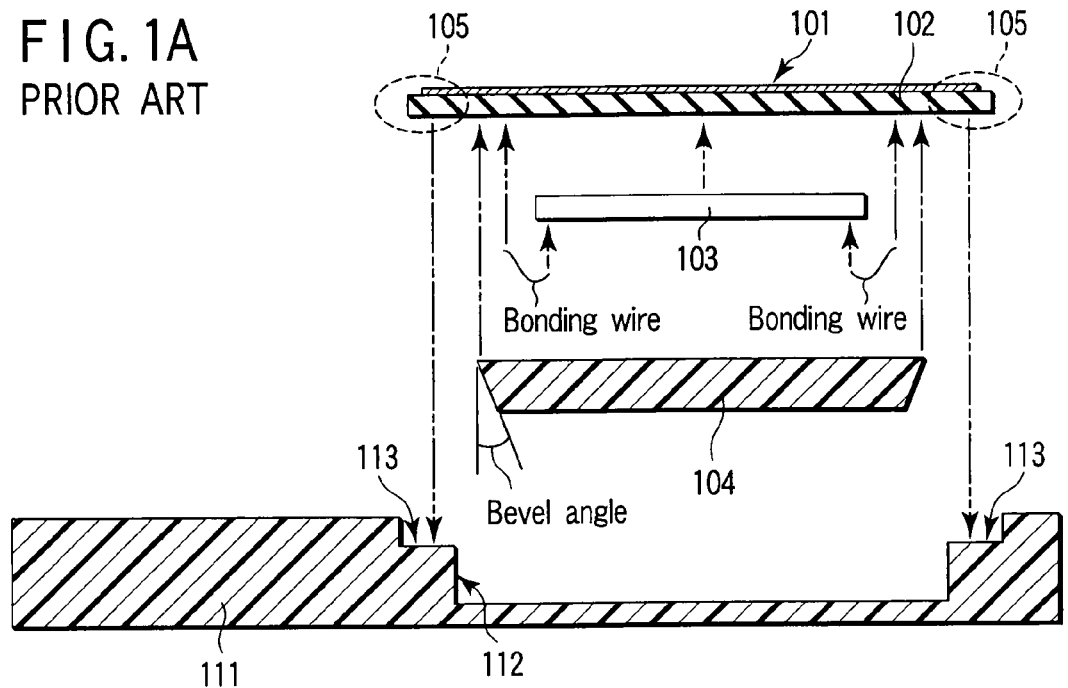
FIG. 1B is an exploded sectional view showing the IC card according to the conventional example.

The concave portion 13 of the base card 11 is very similar to the cavity 112 of the conventional IC card shown in FIGS. 1A and 1B. However, the concave portion 13 is different from the cavity 112 of the conventional IC card only in that the paste edges 113 is not disposed in a periphery. This is because thought or concept of the conventional IC card lies in that the package or chip is buried or contained in the IC card. On the other hand, the thought or concept of the IC card according to the embodiment lies in that the package is attached to the IC card. The bottom of the concave portion 13 is, figuratively speaking, the paste edges.

Figure 5:
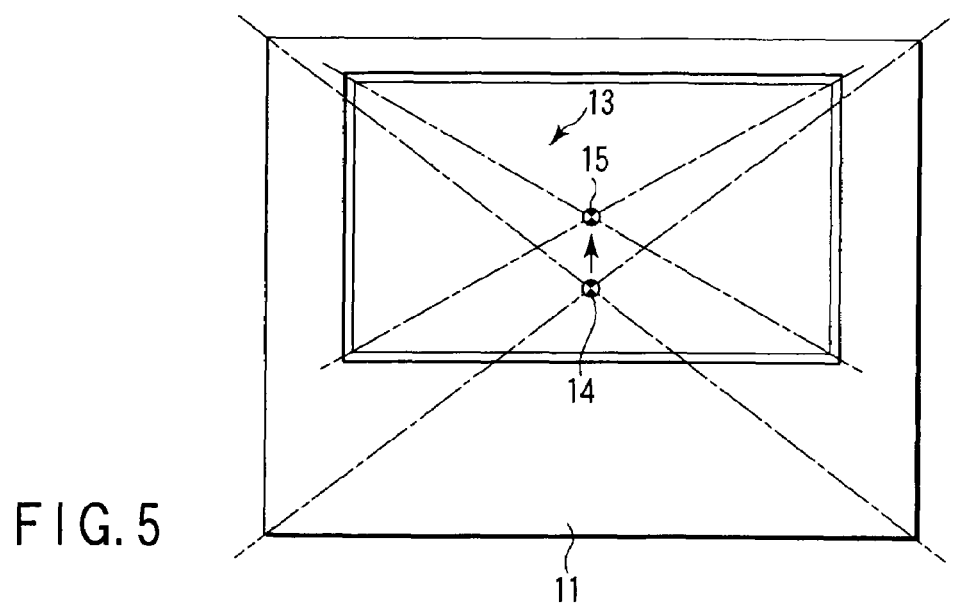
FIG. 5 is a plan view showing one example of a position where a concave portion is formed.

As shown in FIG. 5, one example of the position where the concave portion 13 of the base card 11 is disposed is a position deviating from a center 14 of the base card 11. Concretely, as shown in FIG. 5, a center 15 of the concave portion 13 is shifted from the center 14 of the base card 11 and disposed. Accordingly, a bond center deviates from the center 14 of the base card 11. One of advantages of deviation of the bond center from the center of the base card 11 lies in that the package does not easily peel off. For example, when the IC card, for example, the base card 11 bends because of an unforeseen external force, the package does not easily peel off as compared with a case in which the bond center agrees with the center of the base card 11.

Figure 6A:
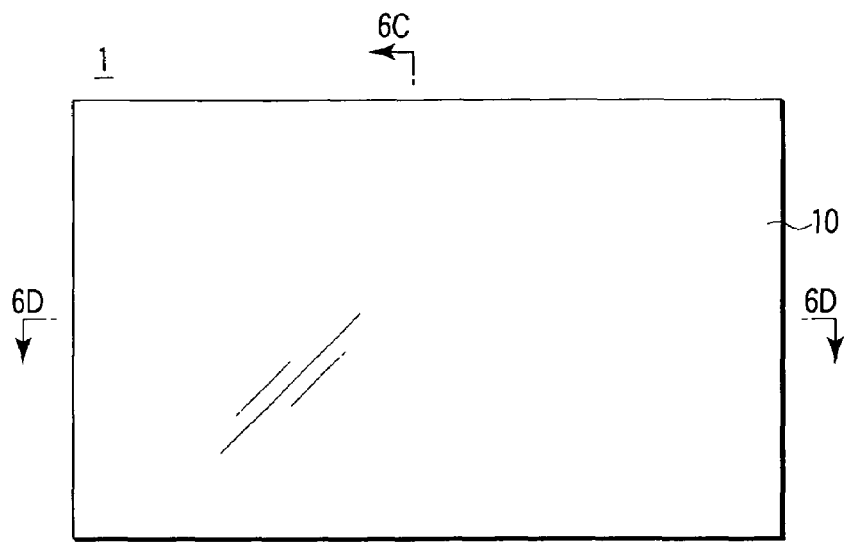
FIGS. 6A and 6B are plan views showing one example of a semiconductor integrated circuit device package for use in the IC card according to the embodiment of the present invention.
Figure 6B:
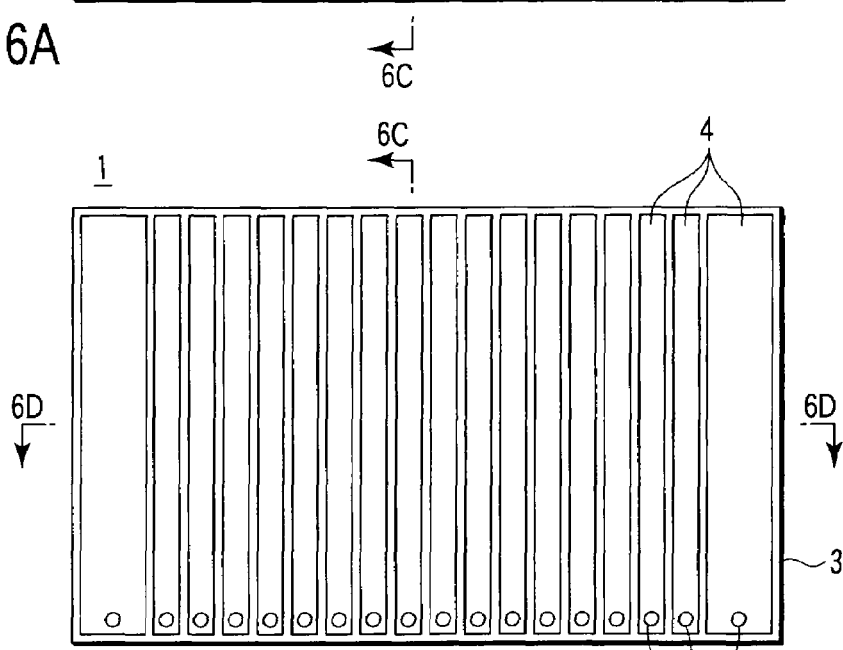
Figure 6C:
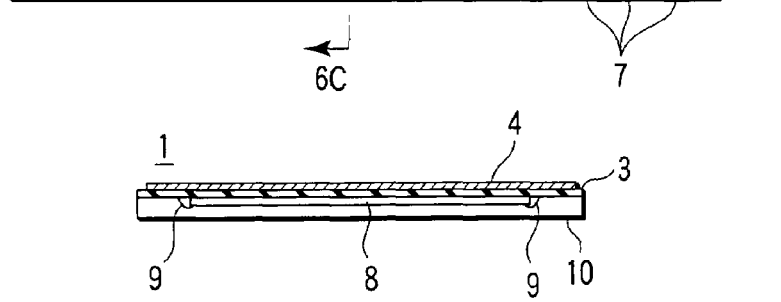
FIG. 6C is a sectional view taken along line 6C-6C in FIGS. 6A and 6B.
Figure 6D:
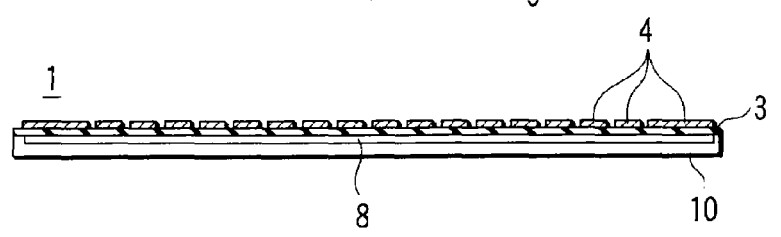
FIG. 6D is a sectional view taken along line 6D-6D in FIGS. 6A and 6B.

FIGS. 6A and 6B are plan views showing one example of a semiconductor integrated circuit device package for use in the IC card according to the embodiment of the present invention, FIG. 6C is a sectional view taken along line 6C-6C in FIGS. 6A and 6B, and FIG. 6D is a sectional view taken along line 6D-6D in FIGS. 6A and 6B.

Figure 2:
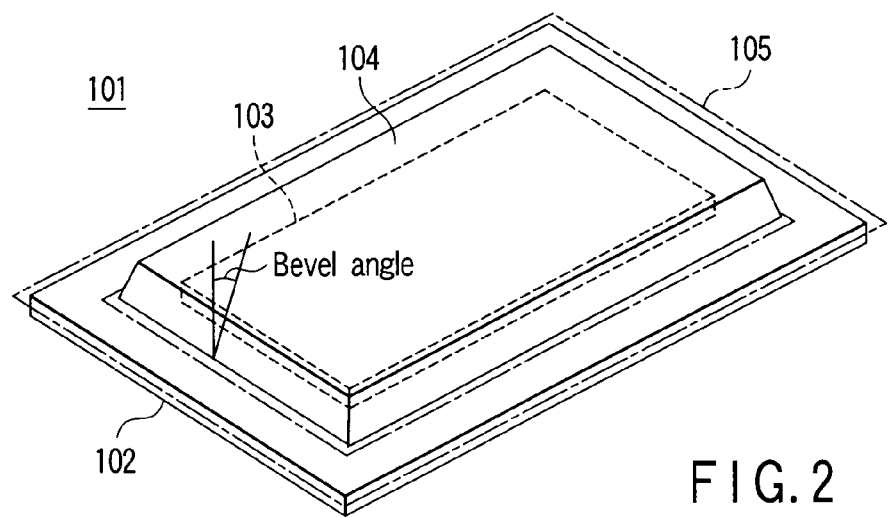
FIG. 2 is a perspective view showing an appearance of a COB type package.

As shown in FIGS. 6A to 6D, one example of the semiconductor integrated circuit device package 1 is, for example, a package including the structure which conforms to a chip on board (COB) type package. In the semiconductor integrated circuit device package 1 according to the present example, there is no fringe as in the conventional COB type package 101 shown in FIGS. 1A, 1B, and 2. It is a so-called fringeless package. One example of the fringeless type package is a rectangular parallelepiped package shown in FIGS. 6A to 6D. A manufacturing example of the rectangular parallelepiped package will be described hereinafter.

Figure 7A:
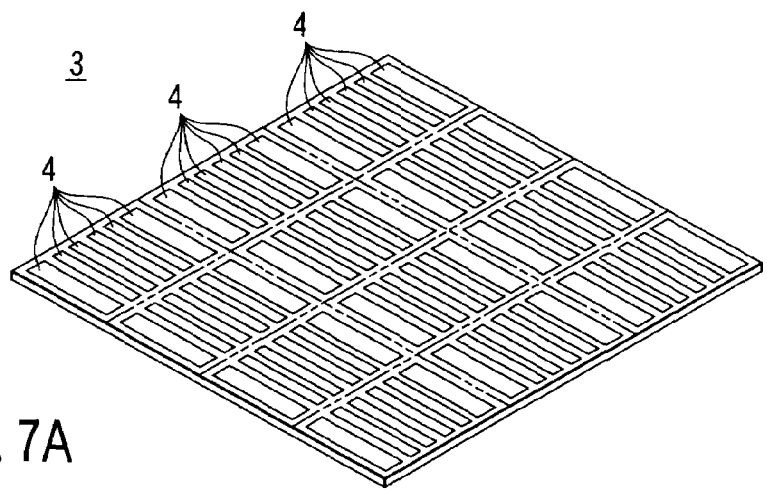
FIGS. 7A and 7B are perspective views showing an example of a wiring board for use in the semiconductor integrated circuit device package according to one example.
Figure 7B:
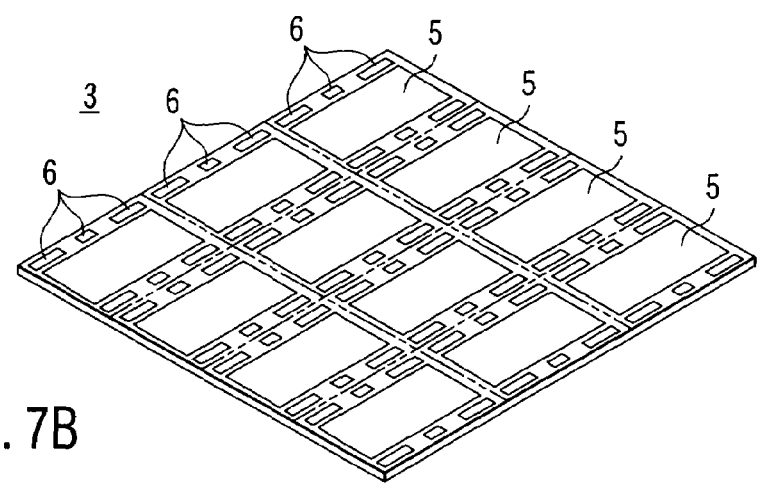

FIGS. 7A and 7B are perspective views showing one example of a wiring board for use in manufacturing the semiconductor integrated circuit device package according to one example, and FIGS. 8A to 8D are perspective views showing a manufacturing method of the semiconductor integrated circuit device package according to one example.

First, a wiring board 3 shown in FIGS. 7A and 7B is prepared. One example of the wiring board 3 is a printed board. Card terminals 4 are disposed on one surface of the wiring board 3 according to the present example. The card terminals 4 in the present specification are, for example, flat terminals which can repeatedly re-contact the terminals of the electronic device. One example of the electronic device is an electronic device in which, for example, the IC cards are used as media. In the other surface disposed opposite to one surface of the wiring board 3, die bond portions 5 to which semiconductor integrated circuit chips are die-bonded, and wirings 6 electrically connected to pads of the semiconductor integrated circuit chips. The wirings 6 are connected to the card terminals 4 via connection portions 7 (see FIG. 6B) disposed in the wiring board 3. The wiring board 3 may be not only the printed board but also a single-layer wiring tape substrate in which there is a hole in a part of an insulating layer, or a multi-layered wiring substrate which includes a via hole.

Figure 8A:
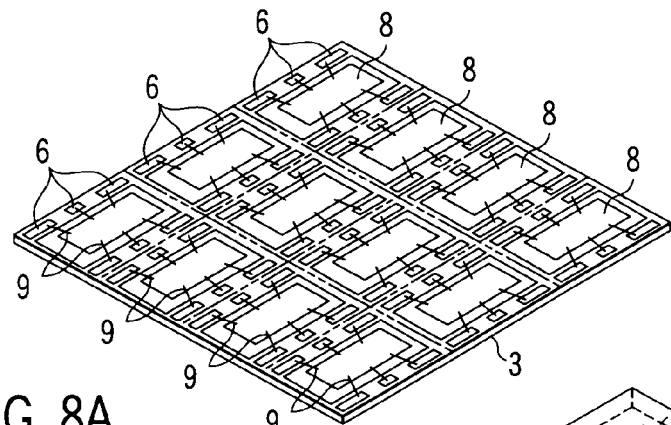
FIGS. 8A to 8D are perspective views showing a manufacturing method of the semiconductor integrated circuit device package according to one example.

Next, as shown in FIG. 8A, a plurality of semiconductor integrated circuit chips 8 are die-bonded to the wiring board 3. Furthermore, the pads of the plurality of chips 8 are electrically connected to the wirings 6. One example of electric connection of the pads of the chips 8 to the wirings 6 is wire bond using bonding wires 9, but is not limited to the wire bond.

Figure 8B:
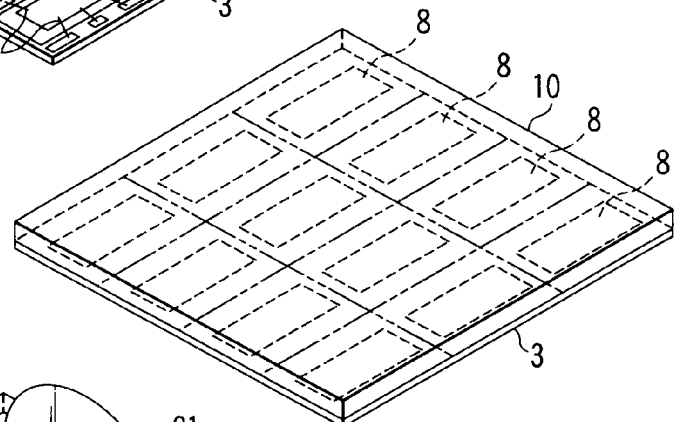

Next, as shown in FIG. 8B, the plurality of chips 8 are coated with an insulating resin 10. One example of the insulating resin 10 is an insulating plastic.

Figure 8C:
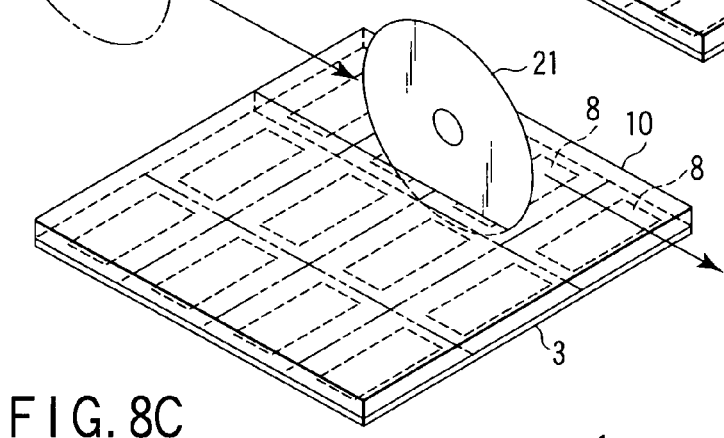
Figure 8D:
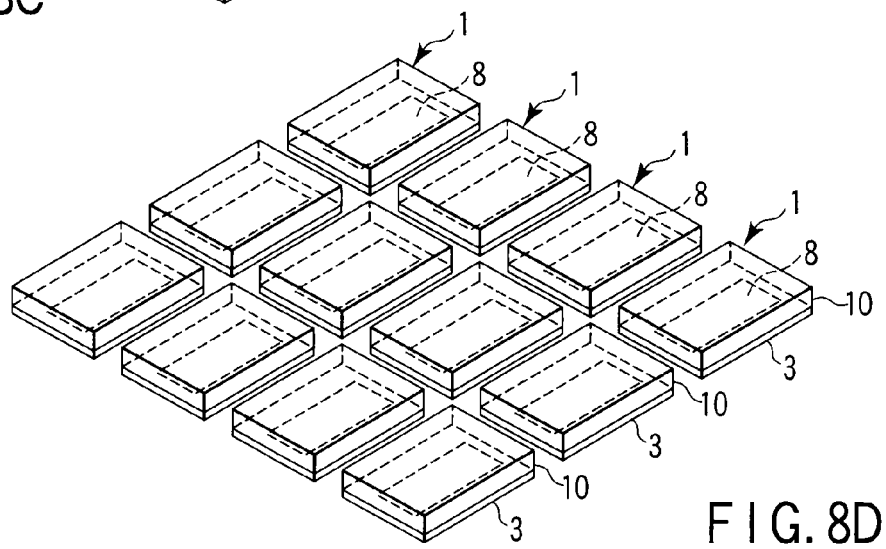

Next, as shown in FIG. 8C, for example, a dicer 21 is used to dice the wiring board 3 and resin 10 to obtain the rectangular parallelepiped package 1 shown in FIG. 8D.

The card terminals 4 shown in FIG. 6B are disposed in one surface of the rectangular parallelepiped package 1. Moreover, as shown in FIG. 6A, for example, only the resin 10 exists in the other surface disposed opposite to one surface. The other surface in which only the resin 10 exists is an attachment surface to the concave portion 13.

According to the IC card of the embodiment, the following effect can be obtained as compared with the conventional IC card.

Figure 9A:
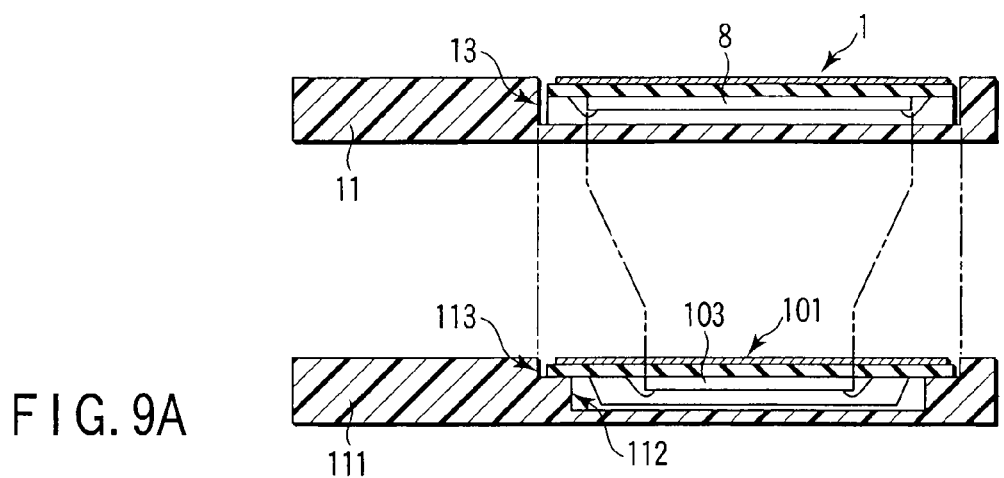
FIGS. 9A and 9B are sectional views showing a typical effect by the IC card according to the embodiment of the present invention.
Figure 9B:
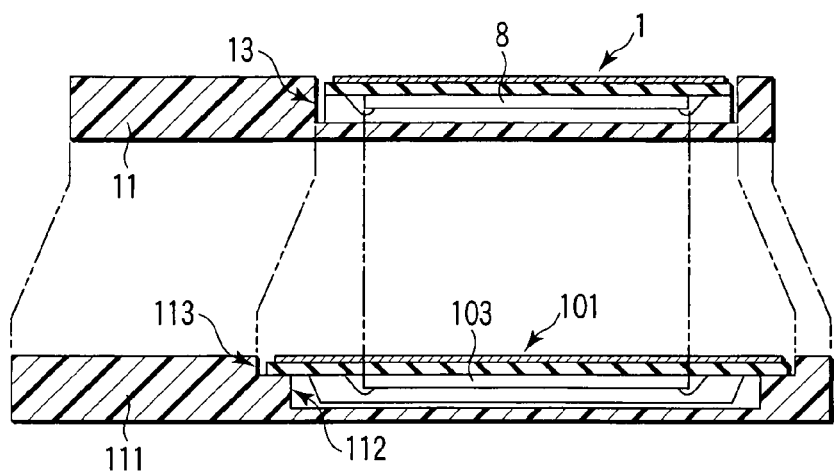

FIGS. 9A and 9B are sectional views showing a typical effect by the IC card according to the embodiment of the present invention.

FIG. 9A shows an example in which a size of the concave portion 13 of the IC card according to the embodiment is set to be the same as that of the paste edge 113 of the conventional IC card.

As shown in FIG. 9A, in the conventional IC card, the size of the cavity 112 is limited by the paste edge 113. On the other hand, in the IC card according to the embodiment, the concave portion 13 is not limited to the paste edge. Therefore, it is possible to mount the large-sized semiconductor integrated circuit device package 1 on the IC card. When the large-sized semiconductor integrated circuit device package 1 can be mounted, the semiconductor integrated circuit chips 8 can be enlarged, and it is possible to obtain an advantage that performance per unit area of the IC card is easily improved. For example, in memory card application, a storage capacity per unit area of the memory card is easily enlarged.

Moreover, since the large-sized chips 8 can be mounted, severe miniaturization does not have to be uselessly demanded, for example, with respect to a semiconductor element or circuit integrated in the chip 3. This reduces development costs, for example, of the chips 8. If the development costs of the chips 8 can be reduced, costs of the IC card itself is advantageously reduced.

FIG. 9B shows an example in which the size of the semiconductor integrated circuit chip 8 of the IC card according to the embodiment is set to be the same as that of the semiconductor integrated circuit chip 103 of the conventional IC card.

It is not necessary to dispose any paste edge around the concave portion 13 in the IC card according to the embodiment. For example, since it is unnecessary to dispose the paste edge 113, the concave portion 13 can be miniaturized, and it is possible to miniaturize the IC card, figuratively speaking the base card 11 in the embodiment. The miniaturization of the IC card is also advantageous for reducing the cost of the IC card.

Moreover, as shown in FIGS. 1A and 1B, the conventional IC card includes a structure in which the fringes 105 of the COB type package 101 are bonded to the paste edge 113. That is, the package 101 requires the fringes 105. On the other hand, in the IC card according to the embodiment, the resin 10 of the semiconductor integrated circuit device package 1 is attached to the bottom of the concave portion 13. Therefore, the fringeless package can be used in the package 1. For the fringeless package, when the size of the package is set to be the same as that of the fringed package, the larger chip 3 can be mounted. Moreover, with the same size as that of the chip 3, the size of the package can be reduced. Therefore, when the fringeless package is attached to the concave portion 13 as in the IC card according to the embodiment, for example, an advantage can be obtained that the IC card can be miniaturized or can be prevented from being enlarged without deteriorating the performance.

Furthermore, examples of the fringeless package include a rectangular parallelepiped package. For the rectangular parallelepiped package, for example, as shown in FIGS. 8A to 8D, the whole package can be diced and obtained. The COB type package 101 shown in FIGS. 1A and 1B includes a structure in which the chip 103 is coated with the resin 104. Therefore, for example, when molding is used, it is necessary to set a bevel angle for enhancing separatability from a metal mold in a side surface of the resin 104. Alternatively, with the use of potting, it is necessary to consider sags of an outer periphery of the resin 104. It is difficult to mount the large-sized chip 103 also from these viewpoints. On the other hand, the rectangular parallelepiped package has an advantage that the larger chip 3 can be contained, because it is not necessary to consider the sags of the resin or to set the relief angle in the resin side surface.

Next, several features devised in the IC card according to the embodiment of the present invention will be described.

[First Structure]

Figure 10A:
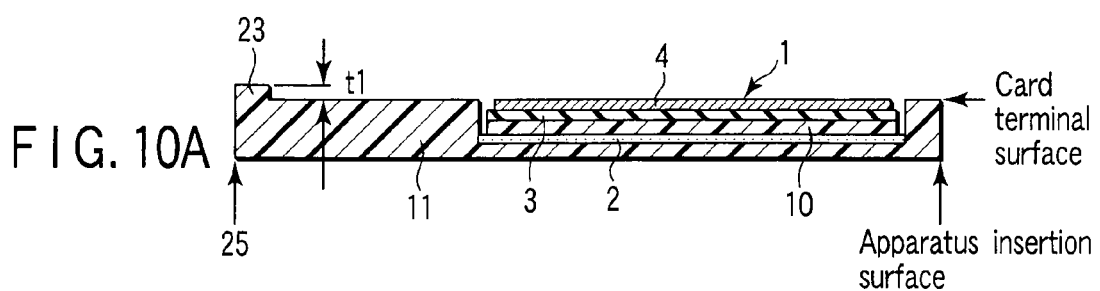
FIG. 10A is a sectional view showing one example of a first structure possessed by the IC card according to the embodiment of the present invention.
Figure 10B:
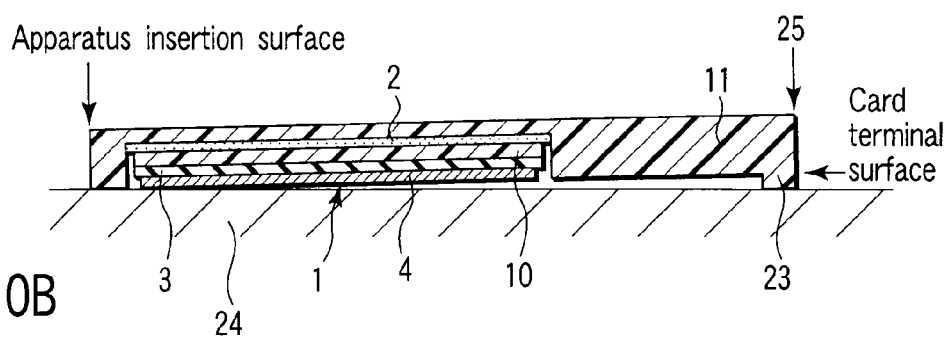
FIG. 10B is a sectional view showing the typical effect by the first structure.

FIG. 10A is a sectional view showing one example of a first structure of the IC card according to the embodiment of the present invention, and FIG. 10B is a sectional view showing the typical effect by the first structure.

As shown in FIG. 10A, a rib 23 is disposed in the card terminal surface of the base card 11. The rib 23 is a portion projecting from the card terminal surface, for example, by a height t1. The rib 23 is disposed in an end of the base card 11, for example, an end 25 disposed opposite to an apparatus insertion surface. For example, the rib 23 is linearly disposed along the end 25 disposed opposite to the apparatus insertion surface.

When the rib 23 is disposed in a card terminal surface, and when the IC card is disposed on a flat surface 24 while directing the card terminal surface downwards, for example, as shown in FIG. 10B, the card terminal 4 does not contact the flat surface 24. Therefore, for example, when the IC card is slid on the flat surface 24, and robbing of the card terminal 4 on another material is encountered, the card terminal 4 is not easily damaged. Particularly, the surface of the card terminal 4 is sometimes subjected to a surface treatment, for example, for a purpose of corrosion control, and this surface treatment is not impaired. This is advantageous in improving the reliability of the IC card, for example, wear resistance.

Moreover, for the corrosion control of the card terminal 4, it is general to plate the surface of the card terminal 4 with a metal superior in corrosion resistance as the surface treatment. The metal superior in the corrosion resistance is a noble metal or a rare metal in many cases, and typical examples include gold and palladium. However, these metals are easily worn away. To increase thickness of plating, a large amount of bare metals are used, and this increases a material cost.

In this respect, with the IC card including the rib 23 in the card terminal surface, a possibility that the surface treatment of the card terminal 4, that is, the plating rubs against another material is low, and it is not necessary to increase the thickness of the plating. Therefore, it is possible to reduce the manufacturing cost, while the card terminal 4 has sufficient corrosion resistance.

Furthermore, when the rib 23 is disposed in the end of the base card 11, for example, the end 25 disposed opposite to the apparatus insertion surface, and when the IC card is inserted/removed, the rib 23 is touched by fingertips. This facilitates the inserting/removing of the IC card, and usability of the IC card becomes satisfactory. To easily catch the rib 23 by the fingers, for example, the rib 23 may linearly be disposed along the end 25 disposed opposite to the apparatus insertion surface.

[Second Structure]

For a related-art IC card, a vertical interval of the card terminal is defined to be 0.1 mm or less with respect to a card terminal surface (e.g., Japanese Industrial Standards: JISX6303). This aims at a vertical interval of 0 of the card terminal with respect to the card terminal surface, and this means that the card terminal is manufactured with a manufacturing tolerance of ±0.1 mm or less such as surge and assembly precision of the card terminal. When this IC card is disposed on the flat surface while directing the card terminal surface downwards, the circuit contacts the flat surface.

Figure 11A:
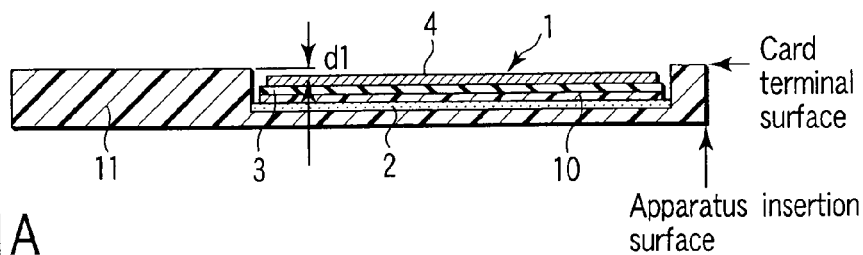
FIG. 11A is a sectional view showing one example of a second structure of the IC card according to the embodiment of the present invention.
Figure 11B:
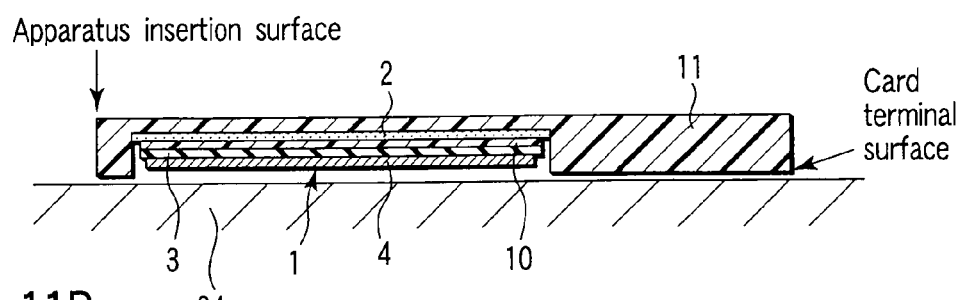
FIG. 11B is a sectional view showing the typical effect according to the second structure.

FIG. 11A is a sectional view showing one example of a second structure of the IC card according to the embodiment of the present invention, and FIG. 11B is a sectional view showing the typical effect according to the second structure.

As shown in FIG. 11A, the position of the surface of the card terminal 4 is set to be lower than that of the card terminal surface of the base card 11, for example, by a depth d1.

Accordingly, when the base card 11 is disposed on the flat surface 24 with the card terminal surface directed downwards as shown in FIG. 11B, the surface of the card terminal 4 does not contact the flat surface 24. One example of the depth d1 exceeds 0.1 mm. That is, the card terminal 4 has a vertical interval exceeding −0.1 mm with respect to the card terminal surface. Moreover, for example, aiming at the vertical interval exceeding −0.1 mm, the manufacturing tolerances such as the surge and assembly precision of the card terminal 4 are set to ±0.1 mm or less in manufacturing the card. Then, the position of the surface of the card terminal 4 can be set to be lower than that of the card terminal surface of the base card 11.

When the position of the surface of the card terminal 4 is set to be lower than that of the card terminal surface of the base card 11 in this manner, the card terminal 4 does not contact the flat surface 24. Therefore, an effect similar to that of the first structure can be obtained.

[Third Structure]

Figure 12A:
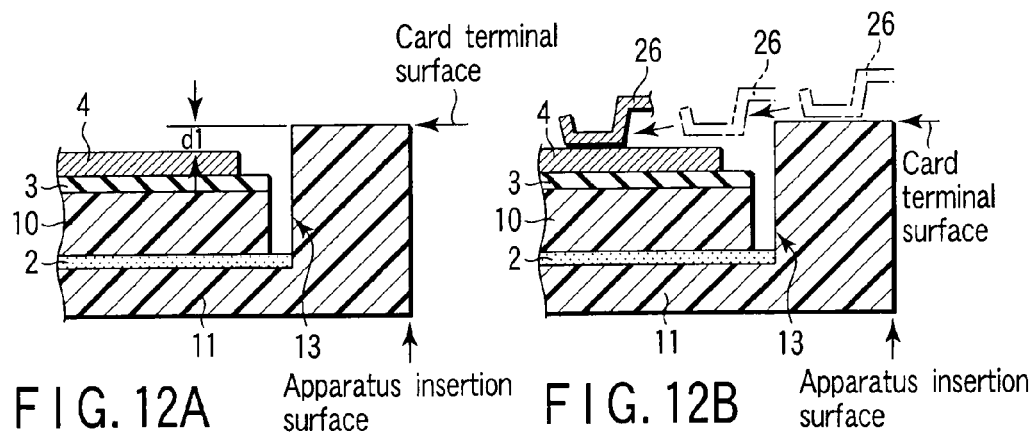
FIG. 12A is a sectional view showing the second structure in an enlarged size.
Figure 12B:
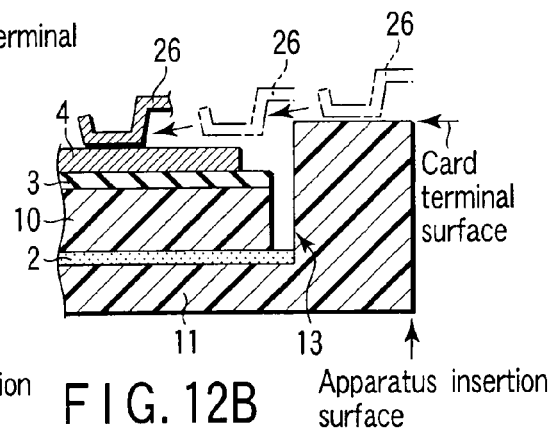
FIG. 12B is a sectional view showing a circumstance of the second structure.

FIG. 12A is a sectional view showing the second structure in an enlarged size, and FIG. 12B is a sectional view showing a circumstance of the second structure.

In the second structure, as shown in FIG. 12A, the position of the surface of the card terminal 4 is set to be lower than that of the card terminal surface of the base card 11 by the depth d1. Therefore, as shown in FIG. 12B, the terminal of an external interface portion of an electronic device, that is, a contact metal 26 of a card reader or card writer is displaced by the depth d1. This has a possibility of shortening life of the contact metal 26. Furthermore, it is necessary to displace the contact metal 26 by the depth d1, and this hampers the miniaturization of the external interface portion. The external interface portion is assembled into various electronic devices in which the IC cards are used as the media, and this also hampers the miniaturization of these electronic device.

To remove the possibility, the third structure may be used.

Figure 13A:
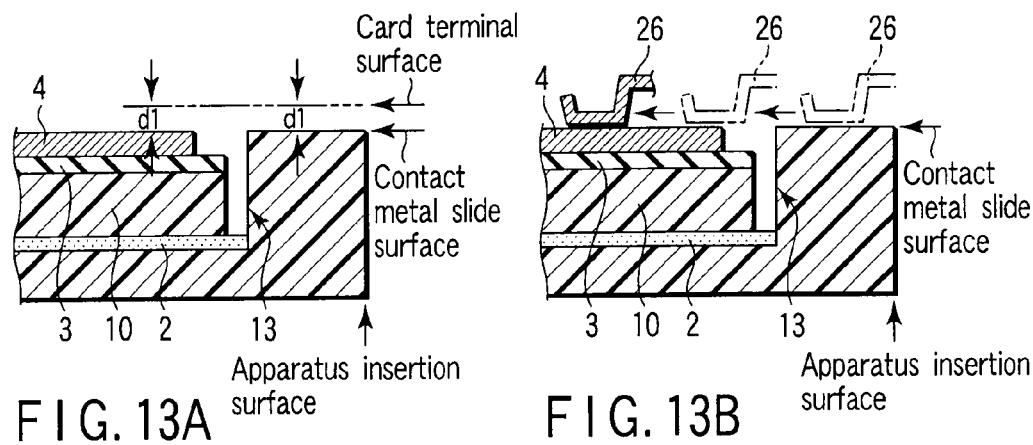
FIG. 13A is a sectional view showing a third structure in the enlarged size.
Figure 13B:
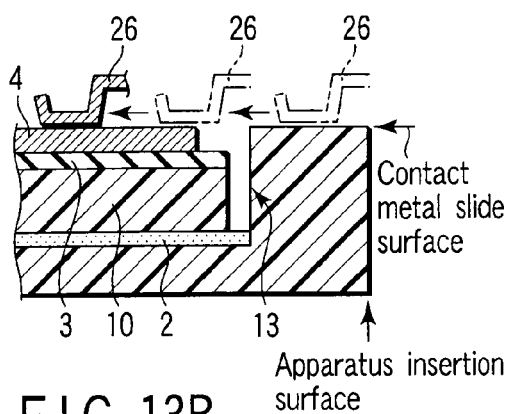
FIG. 13B is a sectional view showing the typical effect by the third structure.

FIG. 13A is a sectional view showing a third structure in the enlarged size, and FIG. 13B is a sectional view showing the typical effect by the third structure.

As shown in FIG. 13A, in the third structure, for the card terminal surface, the position of the terminal of the electronic device, for example, a portion rubbing against the contact metal (hereinafter referred to as the contact metal slide surface) is set to be lower than that of the card terminal surface. The lowering amount is, for example, the depth d1. When the position of the contact metal slide surface is lowered with respect to the card terminal surface by the depth d1, the vertical interval between the positions of the card terminal 4 and contact metal slide surface turns to 0. Accordingly, as shown in FIG. 13B, it is possible to inhibit the displacement of the contact metal 26. As a result, the contact metal 26 is not easily damaged. The miniaturization of the external interface is not hindered.

It is to be noted that the vertical interval between the position of the surface of the card terminal 4 and the position of the contact metal slide surface is set to 0, but this indicates, for example, the vertical interval of 0 in a range of tolerance. In the manufacturing example, for example, the vertical interval between the contact metal slide surface and the card terminal 4 surface is targeted at 0, and the manufacturing tolerances such as the surge and assembly precision of the card terminal 4 may be set to ±0.1 mm or less in manufacturing the card.

Figure 14A:
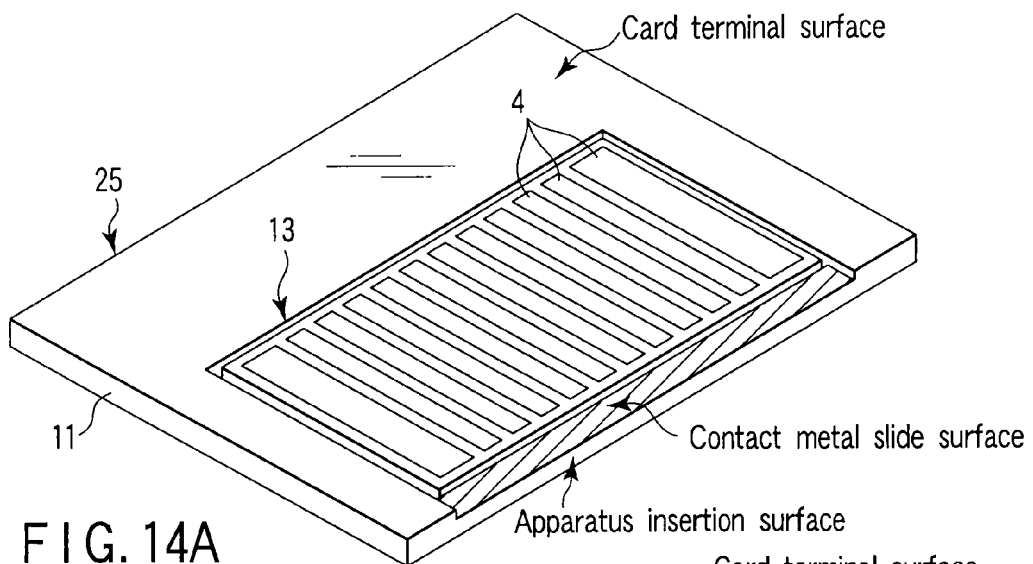
FIGS. 14A to 14C are perspective views showing some examples of the third structure of the IC card according to the embodiment of the present invention.
Figure 14B:
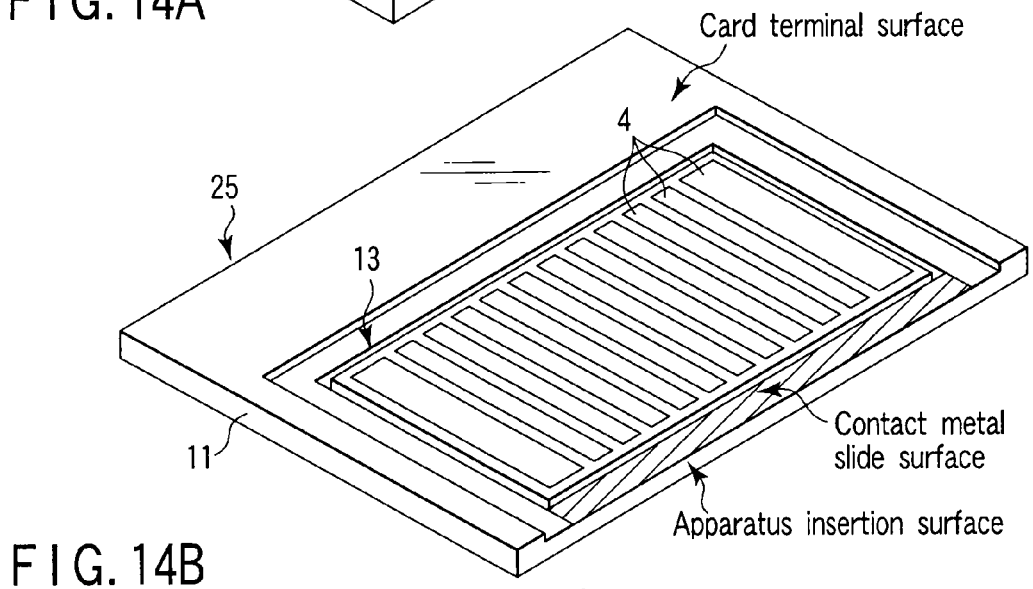
Figure 14C:
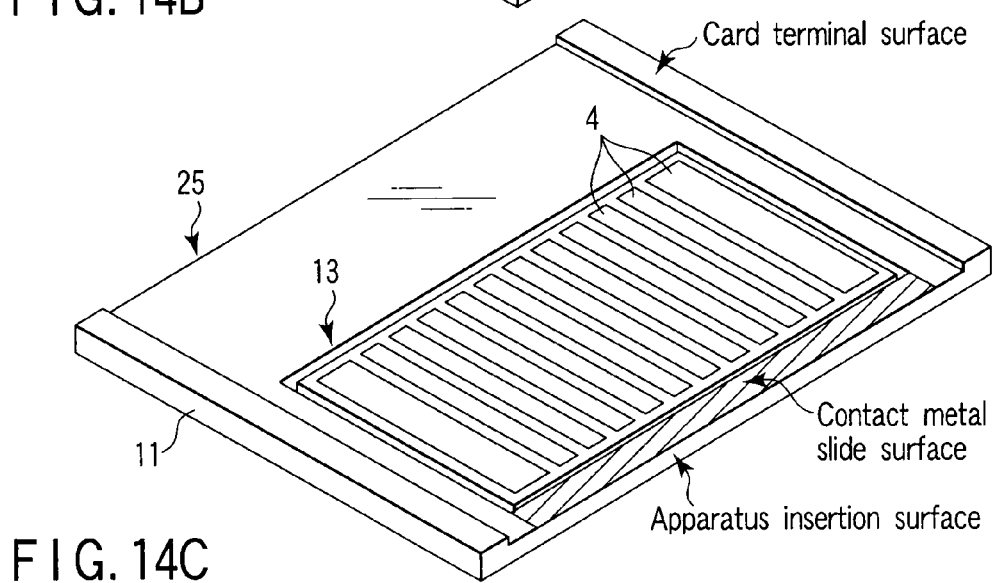

FIGS. 14A to 14C are perspective views showing some examples of the third structure of the IC card according to the embodiment of the present invention.

As a shape of the IC card using the third structure, as shown in FIG. 14A, for the card terminal surface, only the contact metal slide surface may be lowered.

However, as shown in FIG. 14B, not only the contact metal slide surface but also the periphery of the concave portion 13 in the card terminal surface may be lowered. As shown in FIG. 14C, in the card terminal surface, almost the whole surface including the apparatus insertion surface and the end 25 disposed opposite to the apparatus insertion surface may also be lowered. In this case, the card terminal surfaces are left in rib shapes in the opposite ends extending along an apparatus insertion direction of the base card 11.

[Fourth Structure]

Figure 15A:
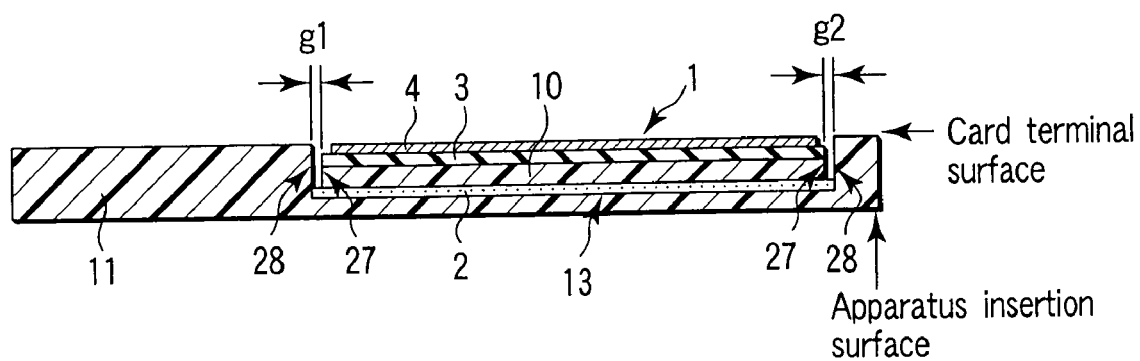
FIGS. 15A to 15C are sectional views showing a background of a fourth structure.
Figure 15B:
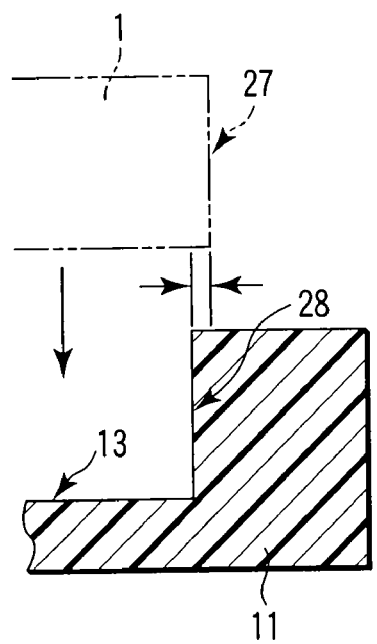
Figure 15C:
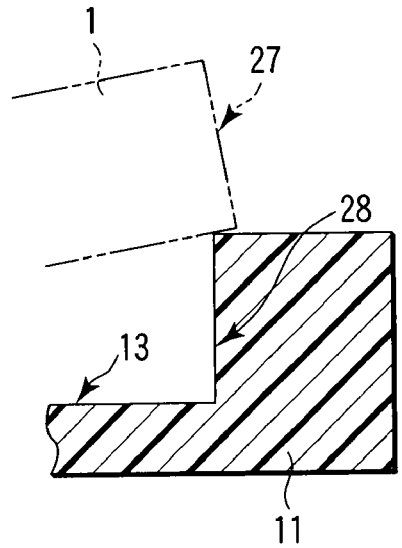

FIGS. 15A to 15C are sectional views showing a background of a fourth structure.

As shown in FIG. 15A, the package 1 is bonded to the bottom of the concave portion 13 of the base card 11. When enlargement of the package 1 and miniaturization of the base card 11 are developed, gaps g1, g2 between side surfaces 27 of the package 1 and side surfaces 28 of the concave portion 13 are much narrowed. When the gaps g1, g2 are narrowed, it becomes to assemble the IC card, especially to drop the package 1 in the bottom of the concave portion 13. For one reason, for example, it becomes difficult to align the package 1 onto the concave portion 13 with good precision. For example, as shown in FIG. 15B, it is assumed that the package 1 has been handled so as to superpose the side surface 27 of the package 1 onto the side surface 28 of the concave portion 13. In this state, the package 1 is dropped toward the bottom of the concave portion 13, or moved downwards. Then, as shown in FIG. 15C, the package 1 is caught and inclined by the base card 11. In this case, assembly becomes incomplete.

To improve this circumstance, the package 1 may be aligned with the concave portion 13 with good precision. However, the high-precision alignment has a demerit that an alignment time increases. When the alignment time increases, an assembly time increases, and this raises the manufacturing cost of the IC card.

To solve the problem, the fourth structure may be used.

Figure 16A:
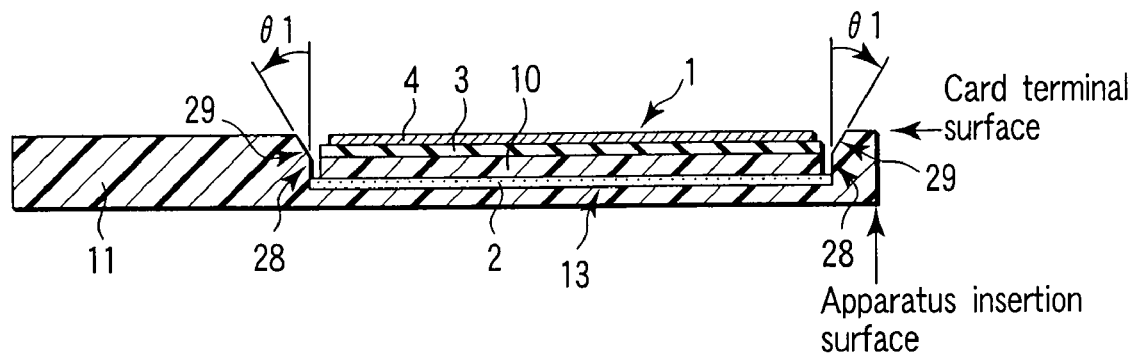
FIG. 16A is a sectional view showing one example of the fourth structure of the IC card according to the embodiment of the present invention.
Figure 16B:
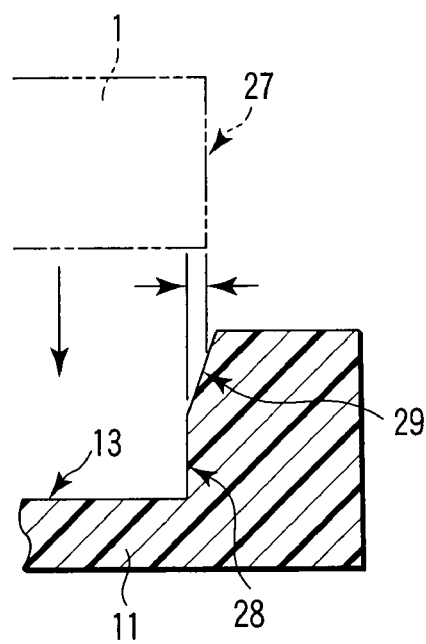
FIGS. 16B and 16C are sectional views showing the typical effect by the fourth structure.
Figure 16C:
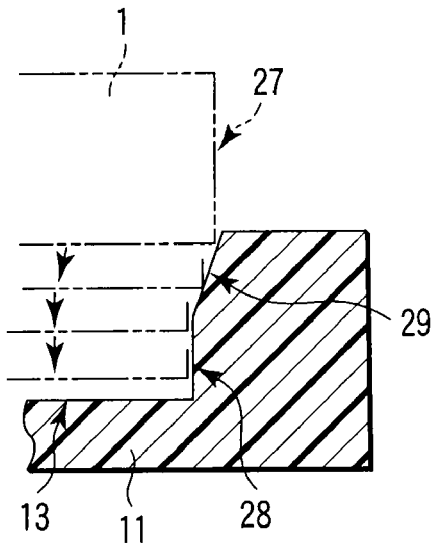

FIG. 16A is a sectional view showing one example of the fourth structure of the IC card according to the embodiment of the present invention, and FIGS. 16B and 16C are sectional views showing the typical effect by the fourth structure.

As shown in FIG. 16A, in the fourth structure, chamfered portions 29 are disposed in corners in which the side surfaces 28 of the concave portion 13 of the base card 11 intersect with the card terminal surface of the base card 11.

With the chamfered portions 29, for example, even when the package 1 is aligned so as to superpose the side surface 27 of the package 1 on the side surface 28 of the concave portion 13 as shown in FIG. 16B, but when the side surface 27 of the package 1 contacts the chamfered portion 29 as shown in FIG. 16C, the package 1 is guided onto the bottom of the concave portion 13 along the chamfered portion 29. As a result, a probability that the assembly becomes incomplete decreases.

Moreover, the alignment of the package 1 with the concave portion 13 may relatively be rough. Therefore, without uselessly increasing the alignment time, it is possible to suppress the useless increase of the manufacturing cost.

It is to be noted that one example of an angle θ1 formed by each chamfered portion 29 with respect to the side surface 28 of the concave portion 13 is about 5°. However, the angle θ1 is not limited to about 5°.

[Fifth Structure:]

Figure 17A:
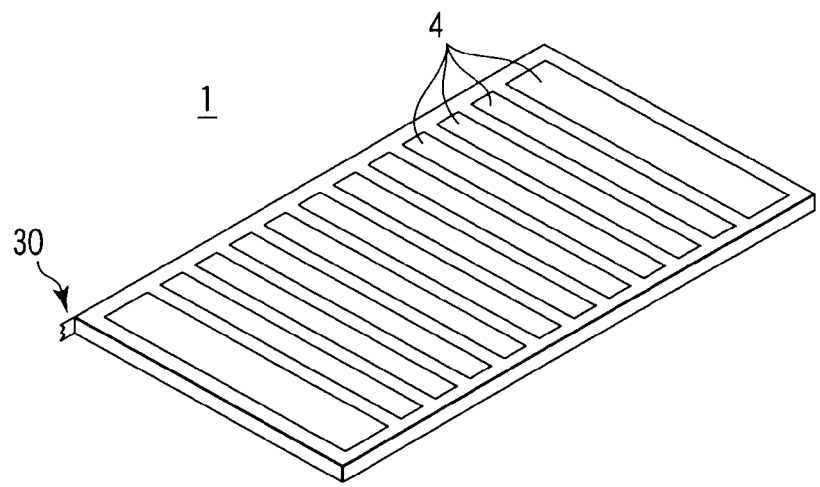
FIGS. 17A and 17B are perspective views showing the background of a fifth structure.
Figure 17B:
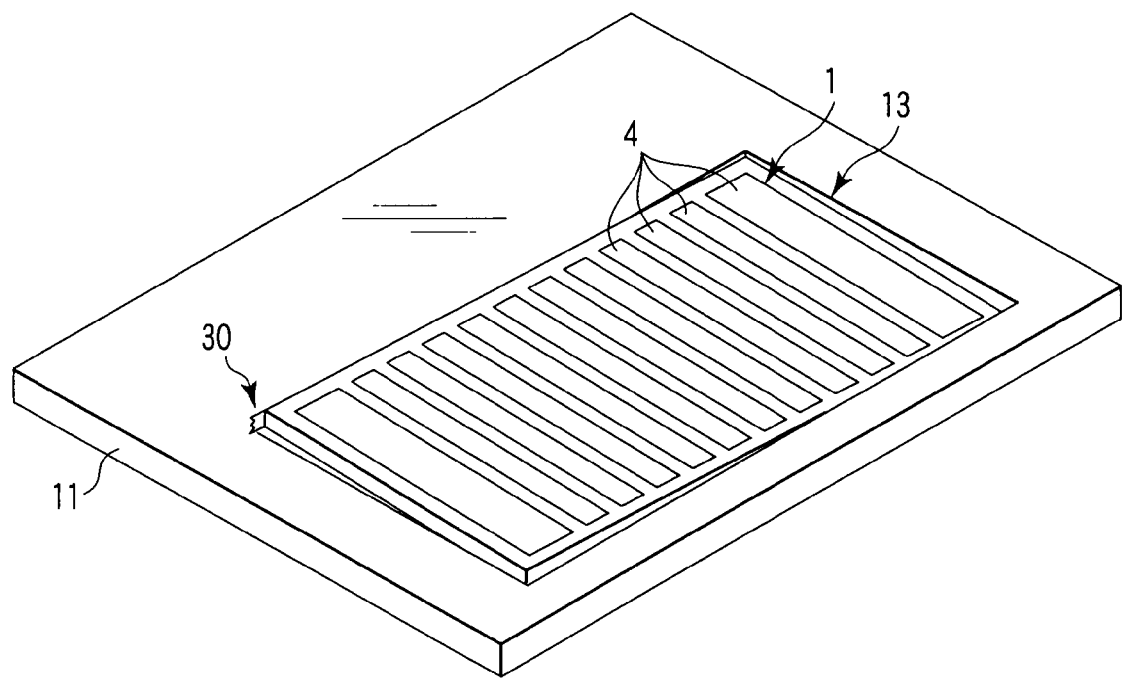

FIGS. 17A and 17B are perspective views showing the background of a fifth structure.

One example of the semiconductor integrated circuit device package for use in the IC card according to the embodiment of the present invention is the package 1 obtained by dicing the whole package as shown in FIGS. 8A to 8D. In the package 1 manufactured in this manner, as shown in FIG. 17A, a burr 30 is sometimes generated in the corner. When the package 1 including the generated burr 30 is bonded to the bottom of the concave portion 13, as shown in FIG. 17B, the burr 30 is stuck in the base card 11, and the assembly becomes incomplete.

To solve the problem, the fifth structure may be used.

Figure 18A:
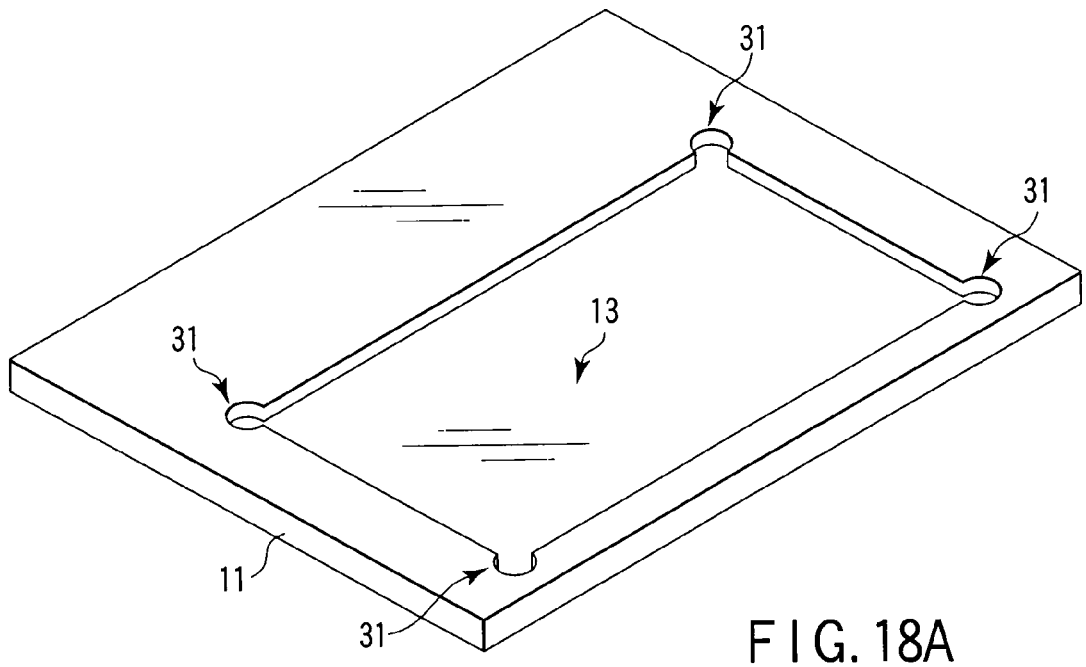
FIG. 18A is a perspective view showing one example of the fifth structure of the IC card according to the embodiment of the present invention.
Figure 18B:
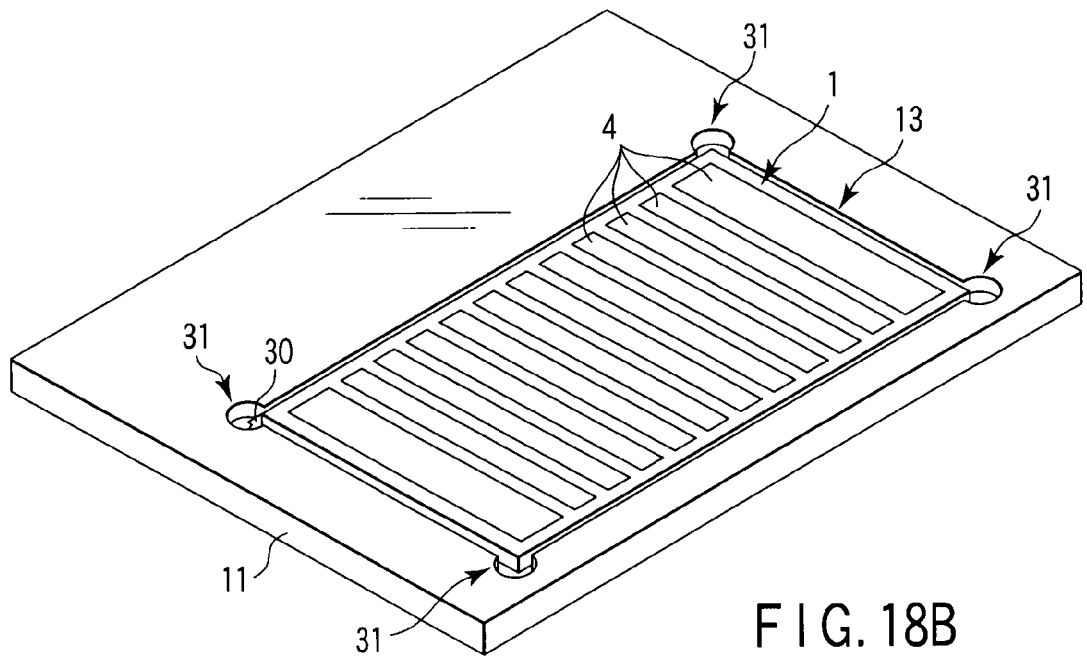
FIG. 18B is a perspective view showing the typical effect by the fifth structure.

FIG. 18A is a perspective view showing one example of the fifth structure of the IC card according to the embodiment of the present invention, and FIG. 18B is a perspective view showing the typical effect by the fifth structure.

As shown in FIG. 18A, in the fifth structure, clearance grooves 31 are disposed in corners in which the side surfaces of the concave portion 13 intersect with each other. In the present example, the clearance grooves 31 are disposed in four corners of the concave portion 13. A flat-surface shape of the clearance groove 31 is, for example, circular, but is not limited to the circular shape.

When the clearance grooves 31 are disposed in the corners of the concave portion 13, as shown in FIG. 18B, the burrs 30 are contained in the clearance grooves 31. Therefore, even the package 1 in which the burr 30 is generated can be bonded to the bottom of the concave portion 13. As a result, the probability that the assembly becomes incomplete decreases.

Moreover, as another advantage by the clearance grooves 31, the clearance grooves 31 also function as fluid reservoirs of superfluous adhesive. The superfluous adhesive sometimes overflows from the gap between the package 1 and the concave portion 13. When the adhesive overflows, the adhesive sticks, for example, to the card terminal 4 and the IC card itself becomes defective. Alternatively, although the IC card is satisfactory, appearance is possibly regarded as defective. These cause a rise in the manufacturing cost of the IC card.

When the clearance grooves 31 are disposed in the concave portion 13, the superfluous adhesive pools in the clearance grooves 31. Therefore, a possibility that the superfluous adhesive overflows can be reduced. As a result, the unnecessary rise of the manufacturing cost can be suppressed.

[Sixth Structure]

FIGS. 19A and 19B are sectional views showing the background of a sixth structure.

To bond the package 1 onto the bottom of the concave portion 13, for example, the adhesive is used. In an assembly process, an amount of adhesive is controlled to be uniform with respect to all the IC cards, but the amount has a certain degree of dispersion. Moreover, viscosity also has a certain degree of dispersion. When the amount or viscosity of the adhesive disperses, as shown in FIGS. 19A and 19B, a thickness t2 of the adhesive 2 varies. This causes a dispersion in the vertical interval between the card terminal surface and the card terminal 4. FIG. 19B shows an example in which the thickness t2 varies to t2', and the vertical interval between the card terminal surface and the card terminal 4 has a dispersion "t2-t2'".

To solve the problem, the sixth structure may be used.

FIG. 20A is a perspective view showing one example of the sixth structure of the IC card according to the embodiment of the present invention, and FIG. 20B is a sectional view showing the typical effect by the sixth structure.

As shown in FIG. 20A, in the sixth structure, protrusions 32 are disposed in the bottom of the concave portion 13 of the base card 11. In the present example, three protrusions 32 are disposed in the bottom of the concave portion 13 to contact the side surfaces of the concave portion 13. These protrusions 32 determine a bottom dead center of the package 1. Accordingly, as shown in FIG. 20B, the package 1 does not go below the protrusions 32. Therefore, even when the amount or viscosity of the adhesive disperses, the vertical interval between the card terminal surface and the card terminal 4 can be reduced.

It is to be noted that in the present example there are three protrusions 32. However, when the bottom dead center of the package 1 can be determined, one or two or three or more protrusions 32 may also be disposed.

Moreover, the protrusions 32 of the present example are disposed to contact the side surfaces of the concave portion 13, but the protrusions do not have to contact the side surfaces of the concave portion 13 as long as the protrusions 32 can determine the bottom dead center of the package 1.

[Seventh Structure]

As described in the fifth structure, when the package 1 is bonded onto the bottom of the concave portion 13 by the adhesive 2 in the IC card according to the embodiment of the present invention, the adhesive sometimes overflows from the gap between the package 1 and the concave portion. The seventh structure relates to further reduction of the possibility that the adhesive overflows.

FIG. 21 is a sectional view showing one example of the seventh structure of the IC card according to the embodiment of the present invention.

As shown in FIG. 21, step portions 33 are disposed in the bottom of the concave portion 13 of the base card 11. The bottoms of the step portions 33 are positioned lower than the bottom of the concave portion 13 so that the superfluous adhesive 2 pools. Moreover, in the present example, the step portions 33 are disposed in contact with the side surfaces of the concave portion 13. However, the present invention is not limited to this, if the superfluous adhesive 2 can be accumulated. Additionally, the superfluous adhesive 2 overflows along the side surfaces of the concave portion 13. Therefore, when the step portions 33 are disposed in contact with the side surfaces of the concave portion 13, the adhesive 2 can effectively be prevented from overflowing.

Moreover, the step portions 33 can also be disposed in a plurality of positions in the bottom of the concave portion 13, but one step portion 33 can also be disposed along the whole periphery of the side surfaces of the concave portion 13.

To more satisfactorily prevent the adhesive 2 from overflowing in this manner, the seventh structure may be used.

FIG. 22 is a sectional view showing a modification example of the seventh structure of the IC card according to the embodiment of the present invention.

When the adhesive 2 is used in the seventh structure as shown in FIG. 22, it is also possible to use the protrusions 32 for determining the bottom dead center of the package 1. In the present modification example, the step portions 33 are disposed in contact with the protrusions 32, but the present invention is not limited to this.

Furthermore, although not especially shown, it is also possible to use the seventh structure together with the fifth structure.

[Eighth Structure]

Figure 23A:
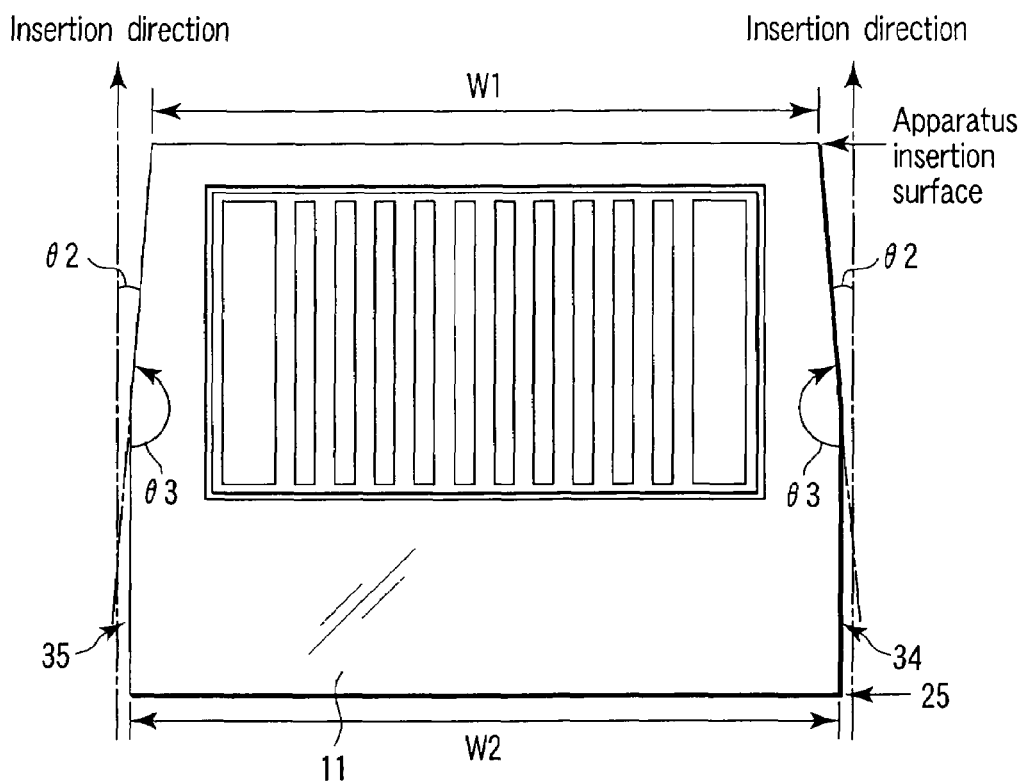
FIG. 23A is a plan view showing one example of an eighth structure of the IC card according to the embodiment of the present invention.
Figure 23B:
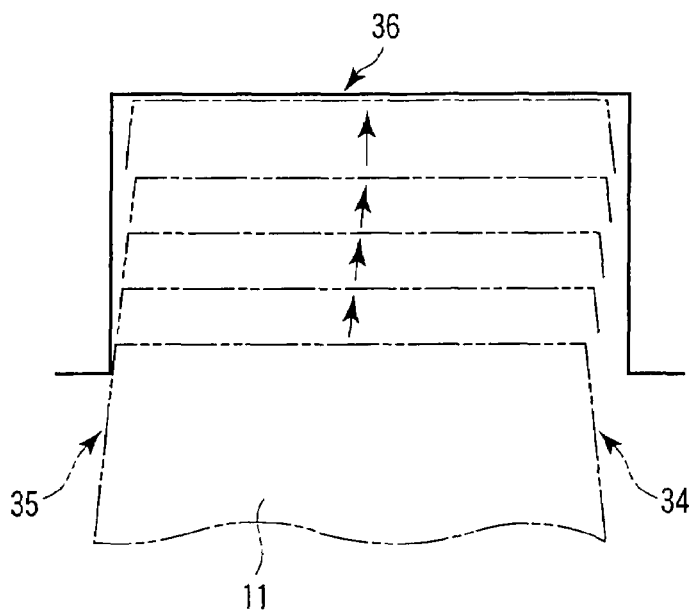
FIG. 23B is a diagram showing the typical effect by the eighth structure.

FIG. 23A is a plan view showing one example of an eighth structure of the IC card according to the embodiment of the present invention, and FIG. 23B is a diagram showing the typical effect by the eighth structure.

As shown in FIG. 23A, in the eighth structure, the width of the base card 11 is narrowed toward an insertion direction into the electronic device. In the present example, a width W1 of the apparatus insertion surface is narrower than a width W2 of the surface 25 disposed opposite to the apparatus insertion surface. Therefore, side surfaces 34, 35 of the base card 11 along the insertion direction into the electronic device are narrowed and tapered toward the insertion direction. One example of an angle θ2 is about 1° with respect to the insertion direction. In the present example, a part of the side surface 34 or 35 of the base card 11 agrees with the insertion direction. Therefore, an angle θ3 measured from the side surface 34 or 35 is about 179°. Of course, these angles θ2, θ3 are only one example, and are not limited to about 1° and 179°, respectively.

The typical effect by the eighth structure is that alignment property of the IC card with a card slot 36 of the external interface is improved.

For example, as shown in FIG. 23B, even when the IC card is inserted deviating from the card slot 36, but when the side surfaces 34, 35 are tapered to be narrowed toward the insertion direction, the IC card is guided into the card slot 36 along the taper. Therefore, the alignment property of the IC card with the card slot 36 is improved.

To further improve the alignment property of the IC card with the card slot 36, the eighth structure may be used.

[Ninth Structure]

FIG. 24A is a plan view showing one example of a ninth structure of the IC card according to the embodiment of the present invention, and FIG. 24B is a diagram showing a typical effect by the ninth structure.

As shown in FIG. 24A, in the ninth structure, the thickness of the base card 11 decreases toward the insertion direction into the electronic device. In the present example, the thickness t2 of the apparatus insertion surface is smaller than the thickness t3 of the surface 25 disposed opposite to the apparatus insertion surface. In the present example, for the card terminal surface of the base card 11 extending along the insertion direction into the electronic device, for example, the contact metal slide surface is thinned and tapered toward the insertion direction. One example of an angle θ4 is about 15° with respect to the insertion direction. Of course, about 15° is only one example, and the angle is not limited to about 15°.

The typical effect by the ninth structure is that a sense of operation of the IC card is softened. There are various factors, but one of possible typical factors is shown in FIG. 24B.

As shown in FIG. 24B, when the IC card is inserted into the external interface, the contact metal slide surface contacts the contact metal 26. From this time, the IC card obliquely slides along the taper of the contact metal slide surface and is inserted with respect to the insertion direction. When the obliquely sliding card is inserted in the insertion direction, a counteracting force against an insertion force, for example, a frictional force is exerted in an oblique direction with respect to the insertion direction. When the frictional force works in the oblique direction with respect to the insertion direction, a sense of resistance transmitted to fingertips is reduced as compared with a case in which the frictional force directly works in the insertion direction. For example, this phenomenon is used as one factor to soften a sense of operation.

[Tenth Structure]

Figure 25A:
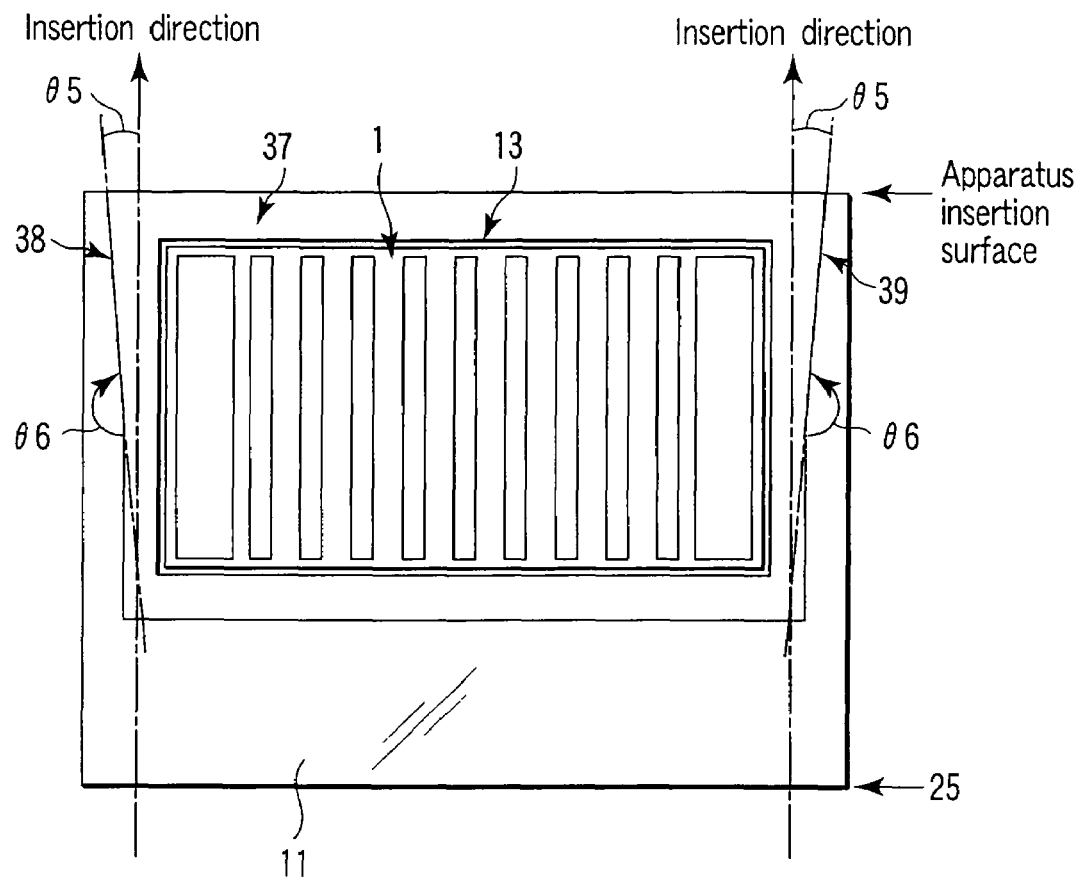
FIG. 25A is a plan view showing one example of a tenth structure of the IC card according to the embodiment of the present invention.
Figure 25B:
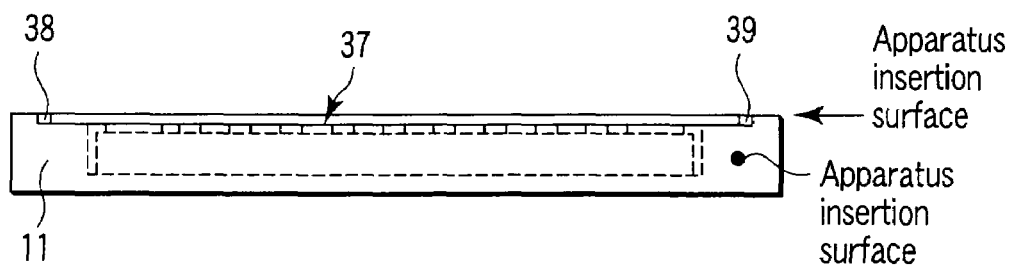
FIG. 25B is a side view showing one example of the tenth structure of the IC card according to the embodiment of the present invention as seen on an apparatus insertion surface side.

FIG. 25A is a plan view showing one example of a tenth structure of the IC card according to the embodiment of the present invention, and FIG. 25B is a side view seen on an apparatus insertion surface side.

In the IC card according to the embodiment of the present invention, the periphery of the concave portion 13 is lowered in the card terminal surface, and a step portion 37 is disposed.

As shown in FIGS. 25A, 25B, in the tenth structure, the width of the step portion 37 is broadened toward the insertion direction into the electronic device. Therefore, side surfaces 38, 39 of the step portion 37 along the insertion direction into the electronic device are tapered so as to broaden toward the insertion direction. One example of an angle θ5 is about 1° with respect to the insertion direction. In the present example, a part of the side surface 38 or 39 of the step portion 37 agrees with the insertion direction. Therefore, an angle θ6 measured from the side surface 38 or 39 is about 179°. Of course, these angles θ5, θ6 are only one example, and are not limited to about 1° and 179°, respectively.

Next, the typical effect by the tenth structure will be described.

Figure 26A:
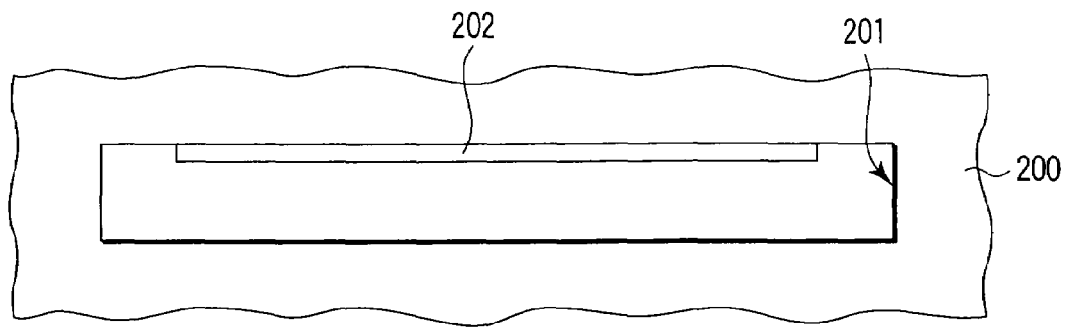
FIG. 26A is a side view of a card slot with a guide as seen on the IC card insertion surface side.
Figure 26B:
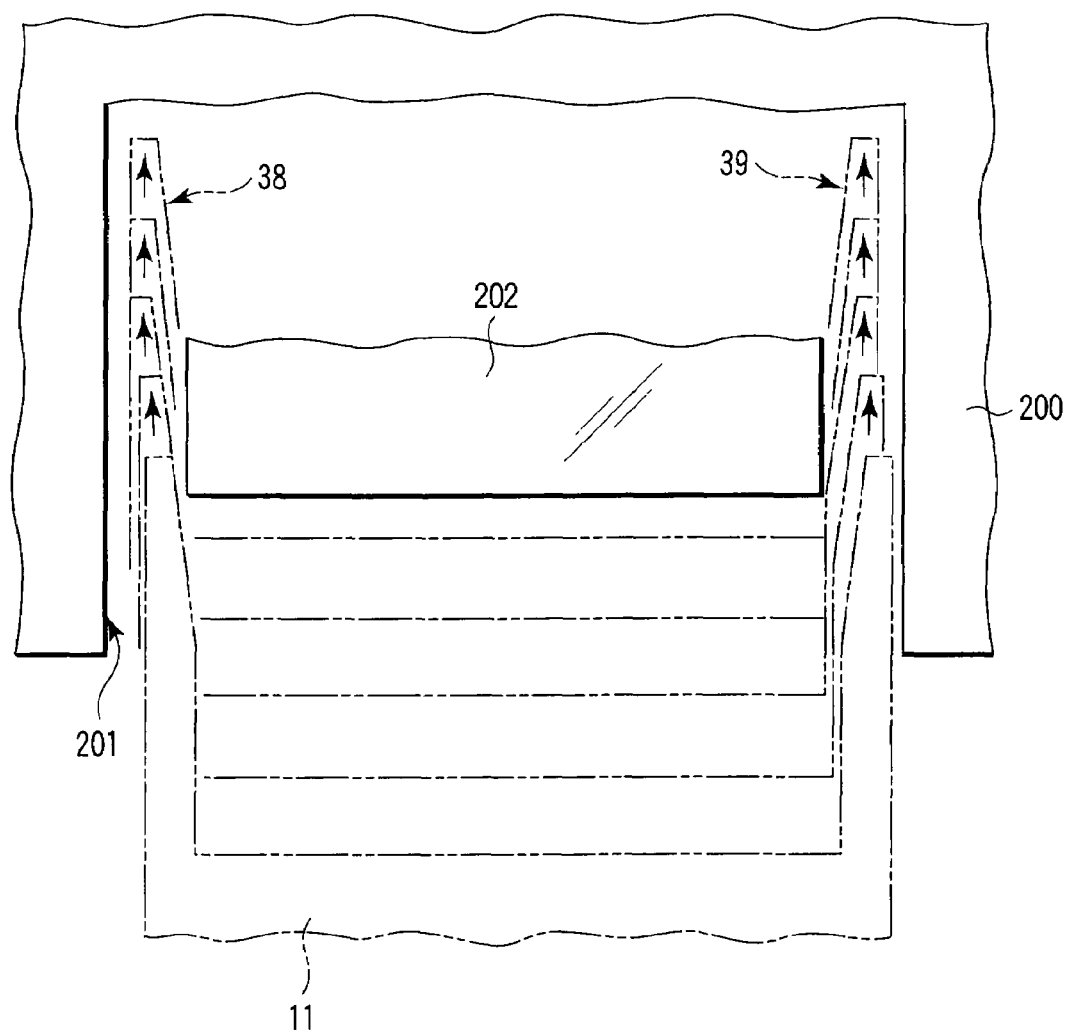
FIG. 26B is a diagram schematically showing insertion of the IC card into the card slot with the guide.

In the tenth structure, the width of the step portion 37 increases toward the insertion direction into the electronic device. This structure can be used to dispose a guide for aligning the IC card in the card slot of the electronic device. FIGS. 26A, 26B show one example of the card slot with the guide.

FIG. 26A is a side view of the card slot with the guide seen on the IC card insertion surface side, and FIG. 26B is a diagram schematically showing IC card insertion.

As shown in FIG. 26A, a guide 202 is disposed in a card slot 201 of an electronic device 200. The guide 202 according to one example is disposed in an upper portion of the card slot 201, and is a guide having a protrusion shape projecting downwards in the card slot 201. Of course, the shape of the guide 202 is not limited to the protrusion shape shown in FIG. 26A.

The base card (IC card) 11 is inserted into the card slot 201 which includes this guide 202. In this case, when the insertion position deviates, as shown in FIG. 26B, either side surface 38 or 39 contacts the guide 202. FIG. 26B shows that the side surface 38 contacts the guide. Thereafter, the base card (IC card) 11 is guided into the card slot 201 along the taper of the side surface 38.

In this manner, according to the tenth structure, for example, an effect can be obtained that the guide 202 for aligning the IC card can newly be disposed in the card slot 201 of the electronic device 200.

Next, a feature devised in the semiconductor integrated circuit device package for use in the IC card according to the embodiment of the present invention will be described.

[Connection of Card Terminal to Chip]

In the wiring board 3, a connection portion 7 is disposed to electrically connect the card terminal 4 to the semiconductor integrated circuit chip 8. There are several mode of the connection portion 7, and typical modes are shown in FIGS. 27A to 27E.

The connection portion 7 shown in FIG. 27A is a mode generally called "through hole". The through hole is disposed in an insulating substrate 41 of the wiring board 3. A conductive material is formed around the hole. The card terminal 4 is connected to the wiring 6 via the conductive material formed around the hole.

The connection portion 7 shown in FIG. 27B is a mode conforming to the through hole shown in FIG. 27A. This portion is different in that the hole disposed in the insulating substrate 41 is filled with the conductive material.

The connection portion 7 shown in FIG. 27C is a mode generally called "blind via". For the blind via, for example, the hole disposed in the insulating substrate 41 is hidden by the conductive material.

Figure 27D:
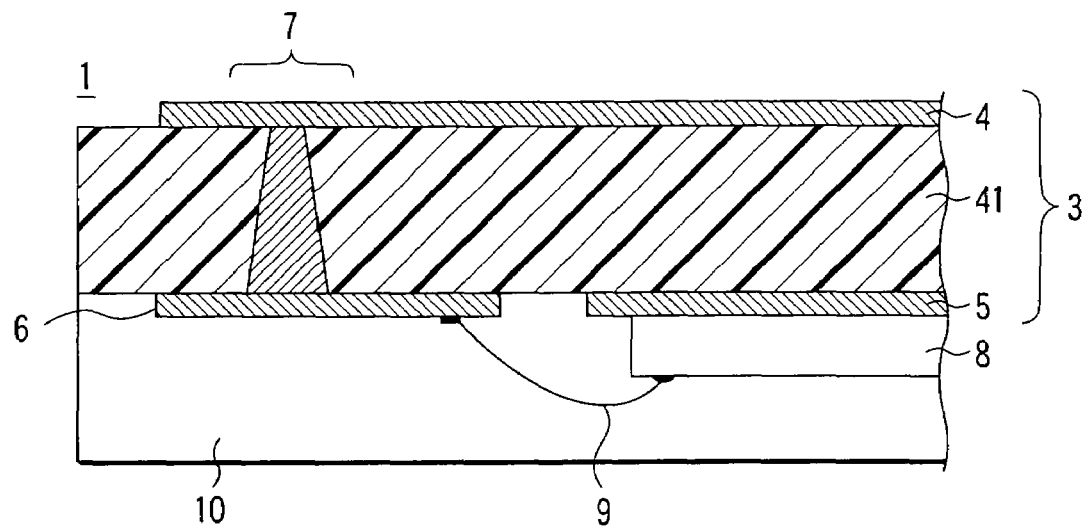
FIG. 27D is a sectional view showing a fourth example of the connection portion.

The connection portion 7 shown in FIG. 27D is a mode generally called "bump". The bump is the conductive material buried in the hole disposed in the insulating substrate 41. The card terminal 4 is connected to the wiring 6 via the conductive material buried in the hole.

Figure 27E:
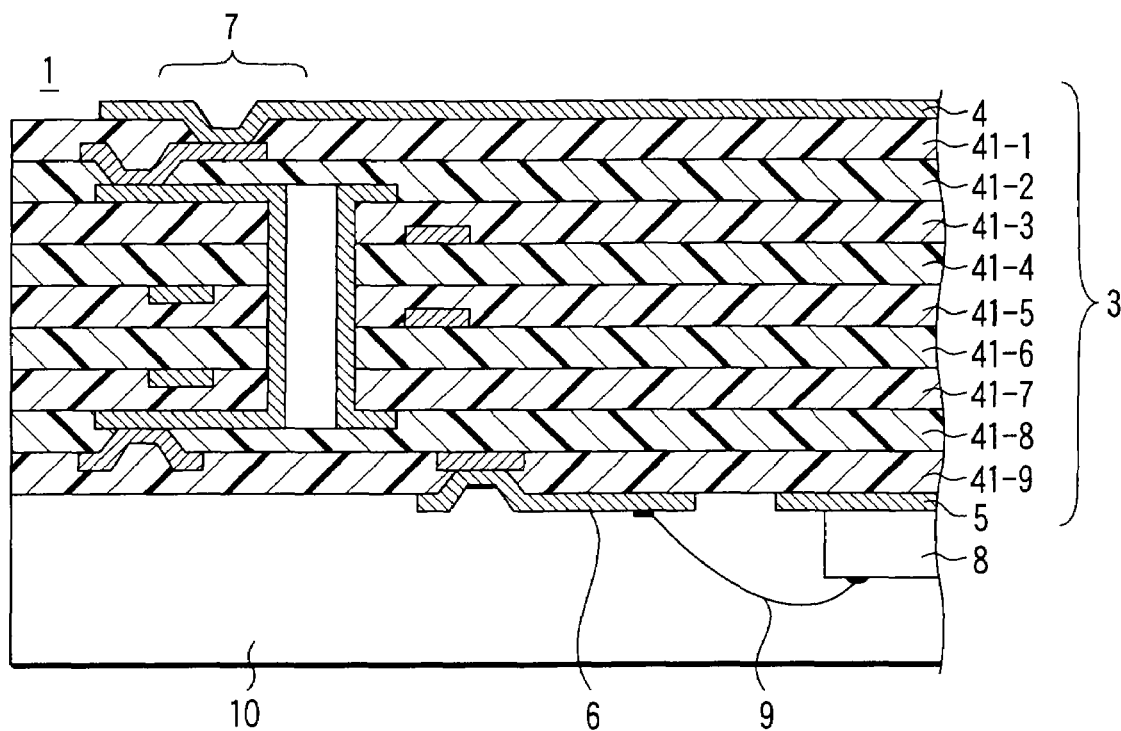
FIG. 27E is a sectional view showing a fifth example of the connection portion.

The connection portion 7 shown in FIG. 27E is a mode generally called "via hole". The via hole is formed down to a middle wiring layer, for example, in the wiring board 3 including the multilayered structure. The card terminal 4 is connected to the wiring 6 via the conductive material formed in the via hole and several layers of wirings.

The mode of the connection portion 7 disposed in the wiring board 3 is formed, for example, in accordance with these modes. Of course, the mode of the connection portion 7 is not limited to the shown modes.

Additionally, the card terminal 4 repeatedly contacts, for example, a contact metal. In this case, a mechanical force is repeatedly added to the card terminal 4 along the flat-surface direction of the wiring board 3. Since the card terminal 4 itself is formed along the flat-surface direction of the wiring board 3, the terminal can bear the mechanical force to a certain degree. However, since the connection portion 7 is formed along the depth direction of the wiring board 3, the portion cannot bear the mechanical force like the card terminal 4. Therefore, when the mechanical force is added to the connection portion 7, the connection portion 7 is possibly destroyed.

Figure 28A:
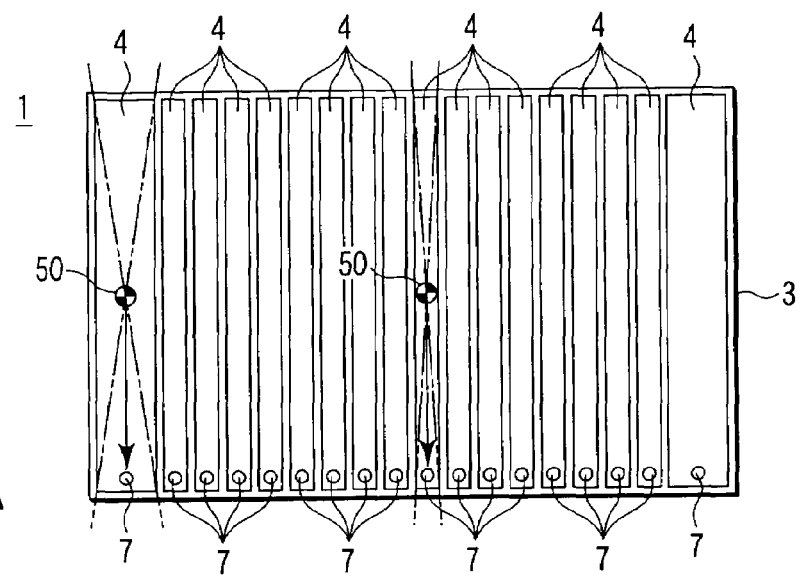
FIGS. 28A to 28C are plan views showing one example of the semiconductor integrated circuit device package for use in the IC card according to the embodiment of the present invention.
Figure 28B:
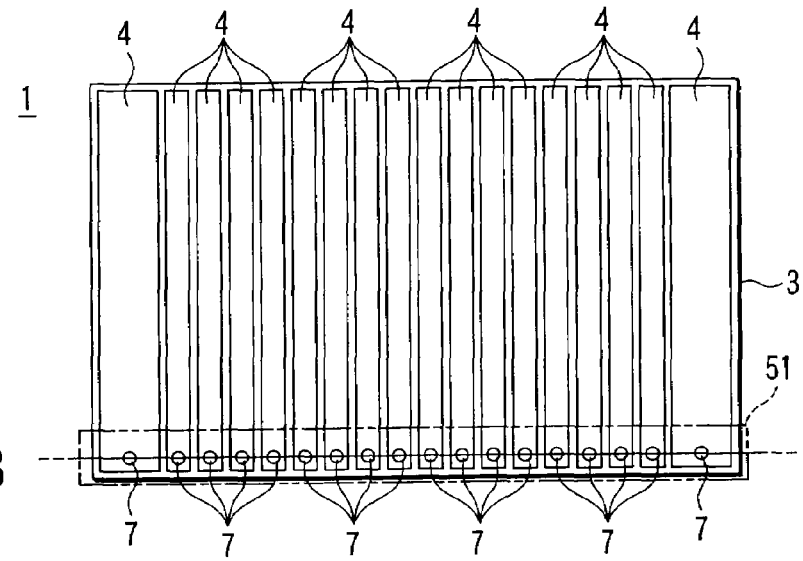
Figure 28C:
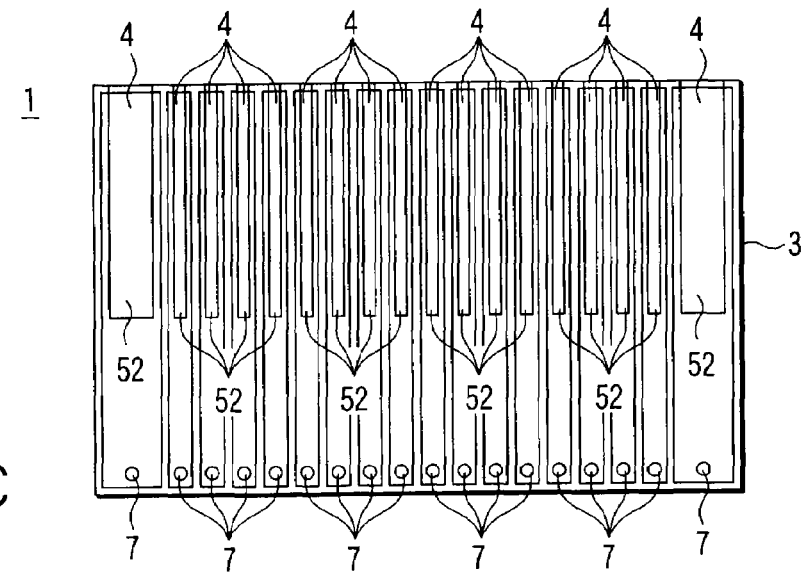

FIGS. 28A to 28C are plan views showing one example of the semiconductor integrated circuit device package for use in the IC card according to the embodiment of the present invention.

As shown in FIG. 28A, the package 1 according to one example includes a plurality of card terminals 4. Each of the card terminals 4 has a straight shape seen from the flat surface. Moreover, the connection portions 7 disposed in the respective card terminals 4 are disposed in positions distributed unevenly from centers 50 of the respective straight card terminals 4. Furthermore, as shown in FIG. 28, for example, the respective connection portions 7 are linearly arranged to be all contained in a straight connection portion region 51. Accordingly, the connection portions 7 are all formed in the straight connection portion region 51. Moreover, for example, as shown in FIG. 3A, the package 1 is bonded to the base card 11 in such a manner that the connection portion region 51 is positioned opposite to the apparatus insertion surface.

When the package is bonded in this manner, the connection portions 7 are disposed on an opposite side with respect to the electronic device insertion surface. For example, as shown in FIG. 28C, the connection portions 7 can be disposed in portions other than regions 52 on which the terminals of the electronic device such as the contact metals rub in the surfaces of the card terminals 4.

When the connection portions 7 are disposed in the regions other than the rubbing regions 52, the connection portions 7 can be prevented from being destroyed, and accidental failure of the semiconductor integrated circuit chip can be reduced. As a result, it is possible to enhance reliability concerning life.

Next, modification examples of the present invention will be described including: several features which can be applied to the IC card according to the embodiment of the present invention or semiconductor integrated circuit device package for use in this IC card; one example of the memory for use in this IC card; and several examples of applications using the IC card.

FIRST MODIFICATION EXAMPLE

Figure 29A:
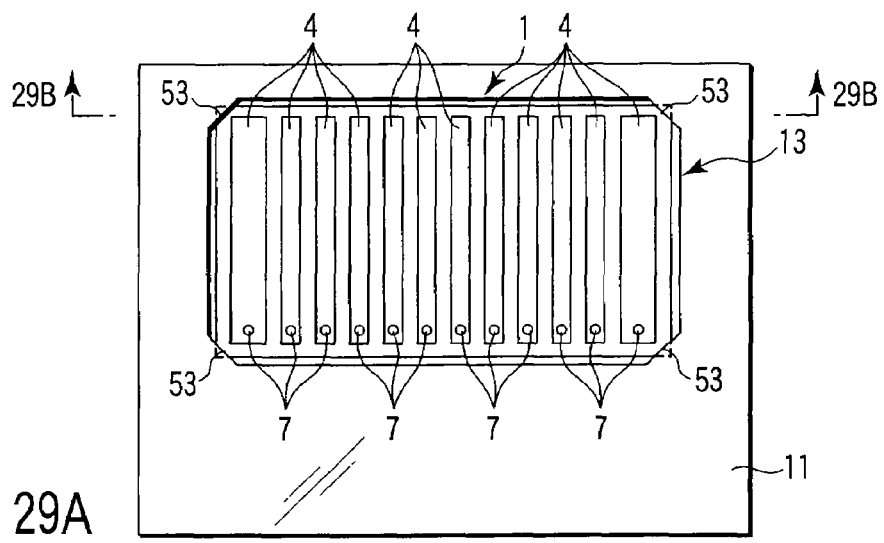
FIG. 29A is a plan view showing the IC card according to a first modification example.
Figure 29B:
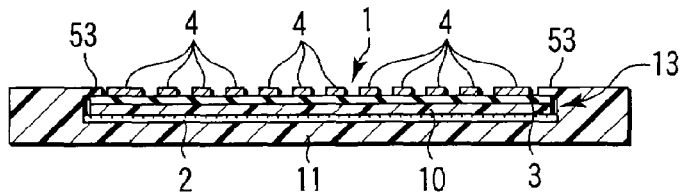
FIG. 29B is a sectional view taken along line 29B-29B in FIG. 29A.

FIG. 29A is a plan view showing the IC card according to a first modification example, and FIG. 29B is a sectional view taken along line 29B-29B in FIG. 29A.

As shown in FIGS. 29A, 29B, in the first modification example, overhangs 53 are disposed in four corners of the concave portion 13 of the base card 11. The overhangs 53 overhang the upper part above the concave portion 13, so that four corners of the package 1 are covered. Accordingly, the package 1 is prevented from being detached from the base card 11.

SECOND MODIFICATION EXAMPLE

Figure 30A:
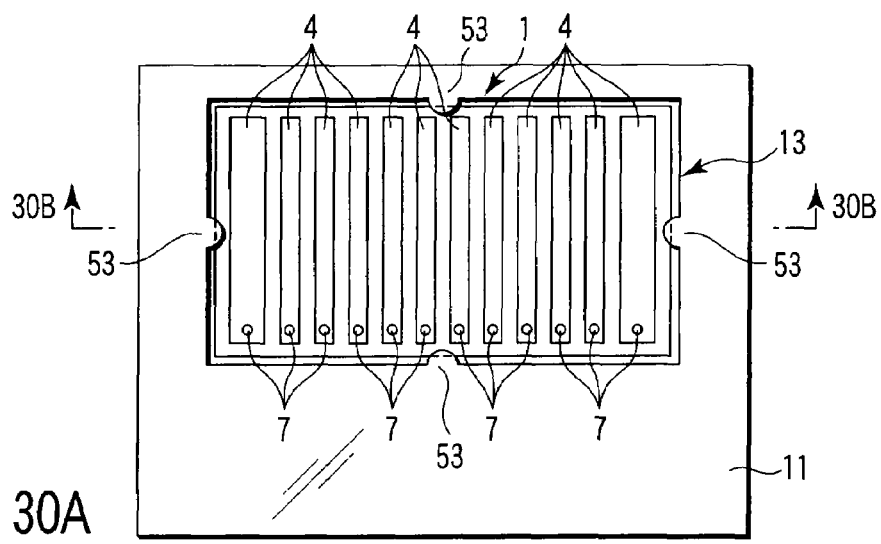
FIG. 30A is a plan view showing the IC card according to a second modification example.
Figure 30B:
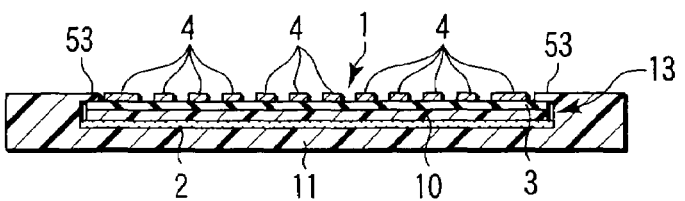
FIG. 30B is a sectional view taken along line 30B-30B in FIG. 30A.

FIG. 30A is a plan view showing the IC card according to a second modification example, and FIG. 30B is a sectional view taken along line 30B-30B in FIG. 30A.

As shown in FIGS. 30A, 30B, in the second modification example, the overhangs 53 are disposed in four sides of the concave portion 13 of the base card 11. Even in this case, in the same manner as in the first modification example, the package 1 can be prevented from accidentally being detached from the base card 11.

It is to be noted that the overhangs 53 according to the first and second modification examples may be formed in the base card 11. After bonding the package 1 to the bottom of the concave portion 13, the overhangs may be attached to the base card 11.

Moreover, when the overhangs 53 are formed in the base card 11, it is difficult to bond the package 1 to the bottom of the concave portion 13. This is because the package 1 is stuck in the overhangs 53.

However, this difficulty can be dissolved by constituting the package 1 as a flexible package represented, for example, by a paper thin package (PTP). Even when the overhangs 53 are above the concave portion 13, but when the flexible package is bent, the package can be inserted into the bottom of the concave portion 13.

THIRD MODIFICATION EXAMPLE

Figure 31A:
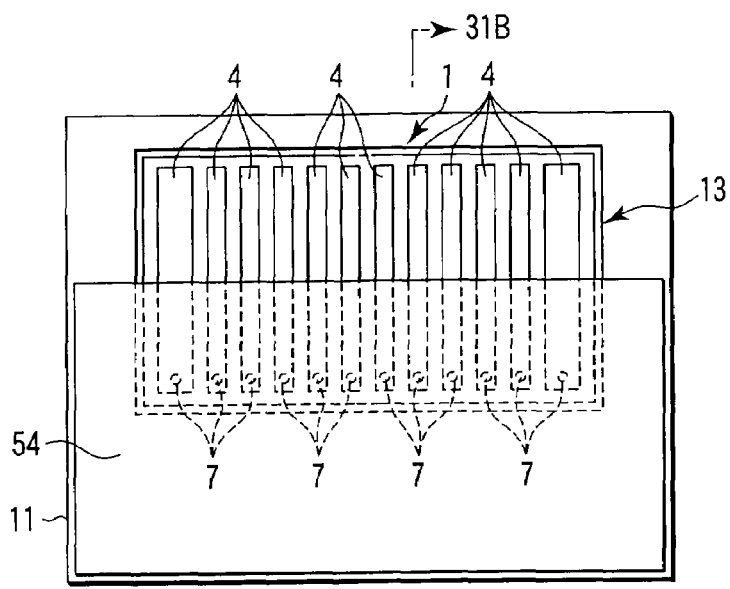
FIG. 31A is a plan view showing the IC card according to a third modification example.
Figure 31B:
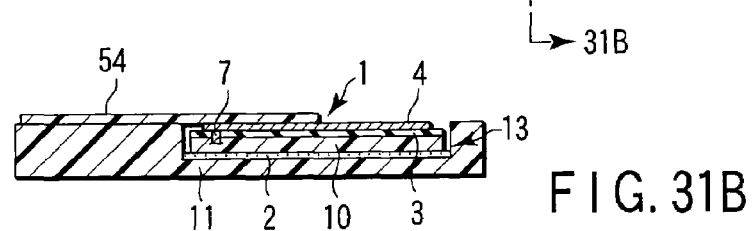
FIG. 31B is a sectional view taken along line 31B-31B in FIG. 31A.

FIG. 31A is a plan view showing the IC card according to a third modification example, and FIG. 31B is a sectional view taken along line 31B-31B in FIG. 31A.

As shown in FIGS. 31A and 31B, in the third modification example, a cover 54 is attached to a part of the package 1 from the card terminal surface of the base card 11. Even in this case, in the same manner as in the first and second modification examples, the package 1 can be prevented from being accidentally detached from the base card 11.

Further in the third modification example, for example, when the connection portions 7 are covered with the cover 54, contamination source or moisture can be prevented from entering the package 1 via the connection portion 7.

As the cover 54, in addition to a plate cover which is not easily deformed, a flexible sheet cover can also be used.

FOURTH MODIFICATION EXAMPLE

Figure 32A:
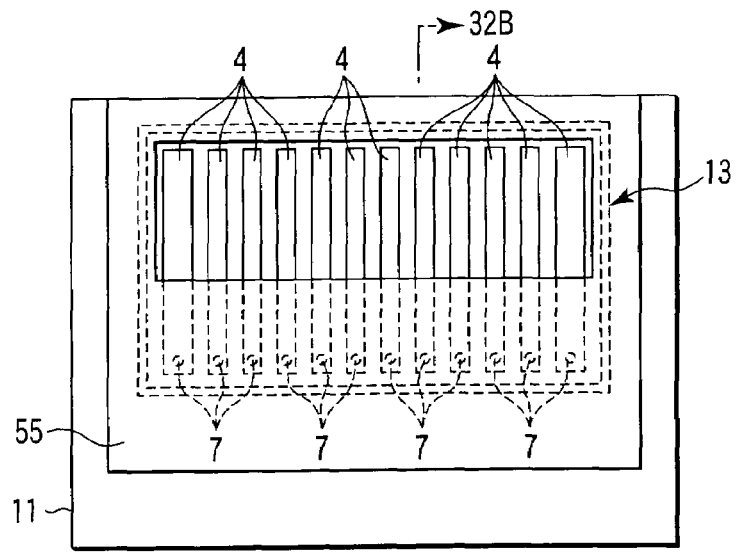
FIG. 32A is a plan view showing the IC card according to a fourth modification example.
Figure 32B:
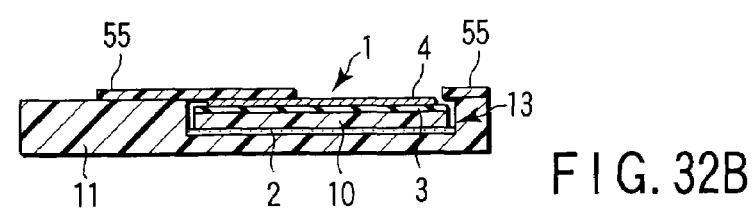
FIG. 32B is a sectional view taken along line 32B-32B in FIG. 32A.

FIG. 32A is a plan view showing the IC card according to a fourth modification example, and FIG. 32B is a sectional view taken along line 32B-32B in FIG. 32A.

As shown in FIGS. 32A and 32B, in the fourth modification example, a cover 55 is attached so as to extend onto one part of the package 1 from the card terminal surface of the base card 11 and further to cover a boundary between the package 1 and concave portion 13. Even in this case, in the same manner as in the first, second, and third modification examples, the package 1 can be prevented from being accidentally detached from the base card 11.

Further in the fourth modification example, for example, when the connection portion 7 is coated with the cover 55, in the same manner as in the third modification example, the contamination source or moisture can effectively be prevented from entering the package 1 via the connection portion 7.

FIFTH MODIFICATION EXAMPLE

FIG. 33A is a plan view showing the IC card according to a fifth modification example, and FIG. 33B is a sectional view taken along line 33B-33B in FIG. 33A.

As shown in FIGS. 33A and 33B, in the fifth modification example, a cover 56 is attached to cover the boundary between the package 1 and concave portion 13. Even in this case, in the same manner as in the first, second, and third modification examples, the package 1 can be prevented from being accidentally detached from the base card 11.

It is not necessary to necessarily coat the connection portion 7 with the cover 56 as in the fifth modification example.

SIXTH MODIFICATION EXAMPLE

FIG. 34 is a plan view showing the semiconductor integrated circuit device package according to a sixth modification example.

As shown in FIG. 34, in the sixth modification example, a length L1 of the straight card terminal 4 is set to be shorter than that shown in FIG. 3A.

The length L1 of the straight card terminal 4 can variously be changed, for example, in accordance with the external interface.

SEVENTH MODIFICATION EXAMPLE

Figure 35:
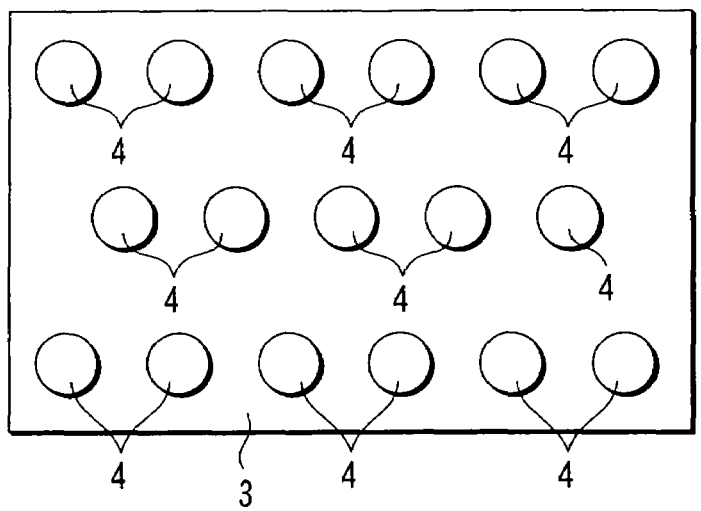
FIG. 35 is a plan view showing the semiconductor integrated circuit device package according to a seventh modification example.

FIG. 35 is a plan view showing the semiconductor integrated circuit device package according to a seventh modification example.

As shown in FIG. 35, in the seventh modification example, a pattern of the card terminal 4 is changed to a land pattern from the straight pattern.

In this manner, the pattern of the card terminal 4 is not limited to the straight pattern, and can variously be designed, for example, in accordance with the external interface.

EIGHTH MODIFICATION EXAMPLE

In an eighth modification example, one example of the semiconductor integrated circuit chip 8 will be described.

Figure 36A:
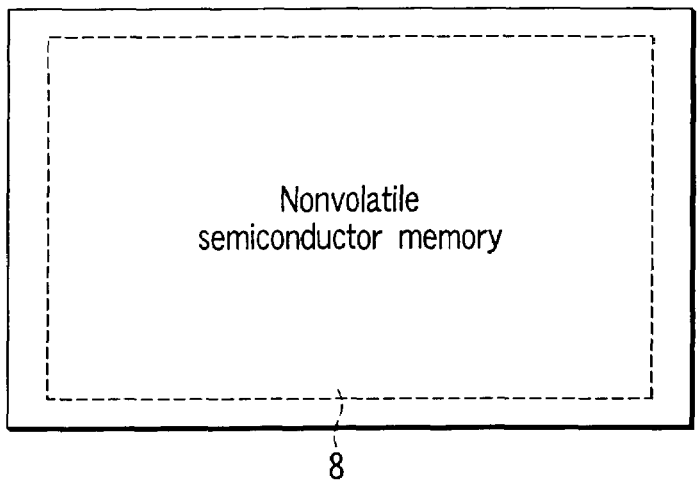
FIG. 36A is a plan view showing the semiconductor integrated circuit device package according to an eighth modification example.
Figure 36B:
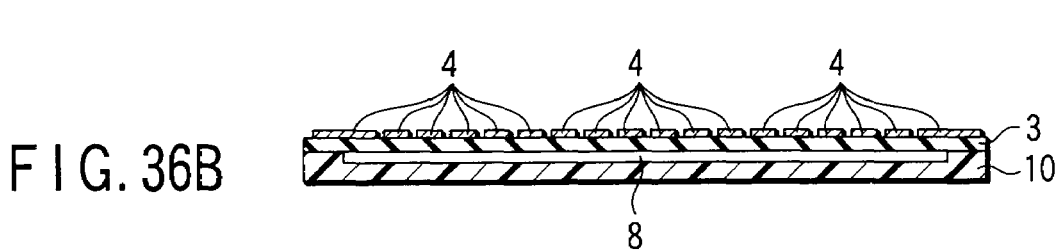
FIG. 36B is a sectional view taken along line 36B-36B in FIG. 36A.

FIG. 36A is a plan view showing the semiconductor integrated circuit device package according to the eighth modification example, and FIG. 36B is a sectional view taken along line 36B-36B in FIG. 36A.

As shown in FIGS. 36A, 36B, one example of the semiconductor integrated circuit chip 8 contained in the package 1 is a nonvolatile semiconductor memory chip. As one example of a nonvolatile semiconductor memory, EEPROM such as a flash memory can be used. However, for the nonvolatile semiconductor memory, it is possible to use the nonvolatile semiconductor memory other than the EEPROM and flash memory.

NINTH MODIFICATION EXAMPLE

Figure 37A:
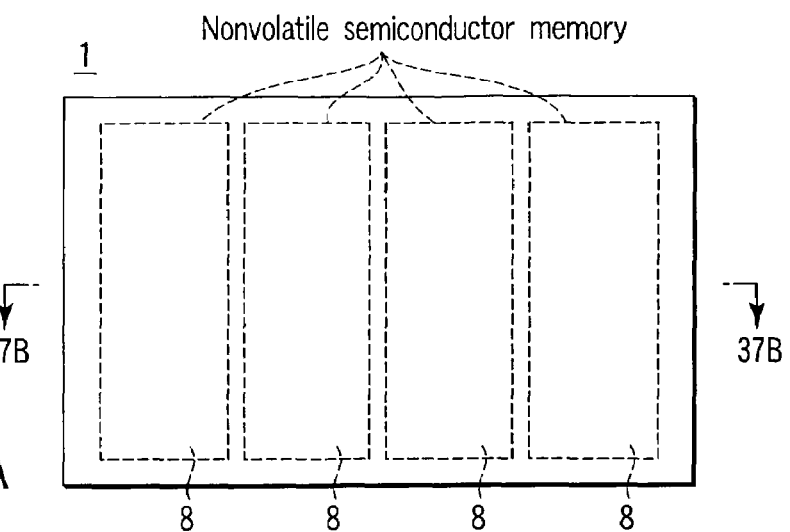
FIG. 37A is a plan view showing the semiconductor integrated circuit device package according to a ninth modification example.
Figure 37B:
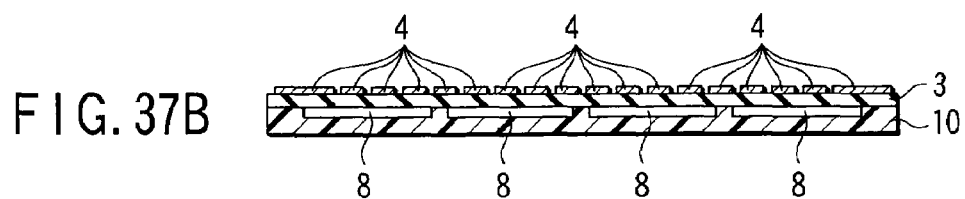
FIG. 37B is a sectional view taken along line 37B-37B in FIG. 37A.

FIG. 37A is a plan view showing the semiconductor integrated circuit device package according to a ninth modification example, and FIG. 37B is a sectional view taken along line 37B-37B in FIG. 37A.

As shown in FIGS. 37A, 37B, in the ninth modification example, a plurality of semiconductor integrated circuit chips 8 are contained in the package 1.

In this manner, the number of chips 8 is not limited to one, and the plurality of chips may be contained. In the ninth modification example, four nonvolatile semiconductor memory chips are contained.

TENTH MODIFICATION EXAMPLE

Figure 38A:
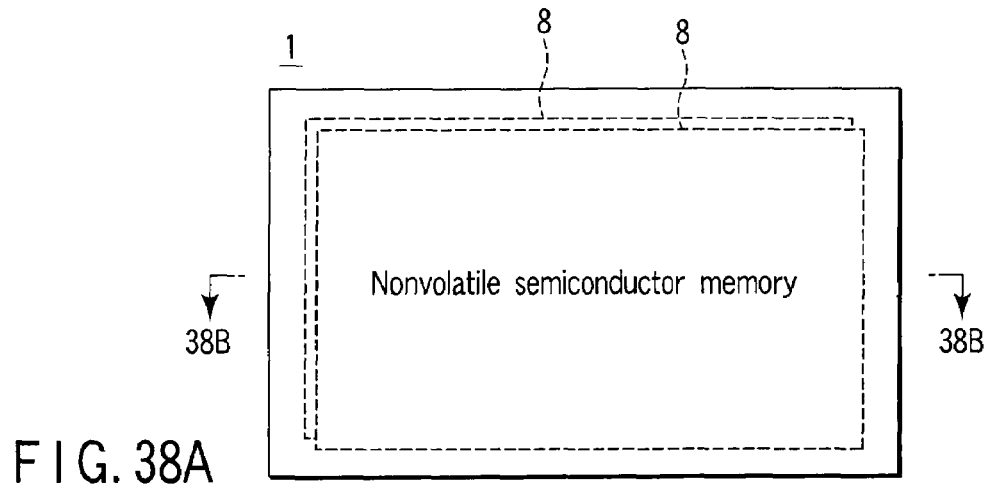
FIG. 38A is a plan view showing the semiconductor integrated circuit device package according to a tenth modification example.
Figure 38B:
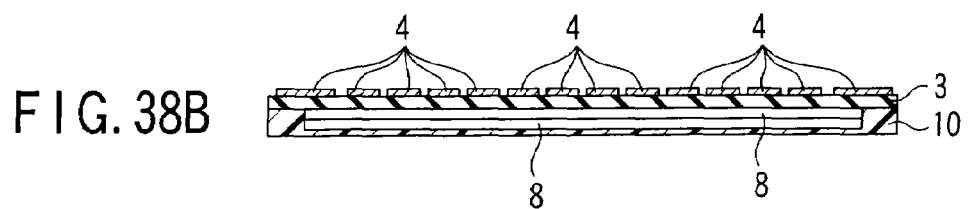
FIG. 38B is a sectional view taken along line 38B-38B in FIG. 38A.

FIG. 38A is a plan view showing the semiconductor integrated circuit device package according to a tenth modification example, and FIG. 38B is a sectional view taken along line 38B-38B in FIG. 38A.

As shown in FIGS. 38A, 38B, in the tenth modification example, a plurality of semiconductor integrated circuit chips 8 are stacked and contained in the package 1.

In this manner, the plurality of chips 8 can not only be arranged horizontally and contained but also be three-dimensionally stacked and contained in the package 1.

ELEVENTH MODIFICATION EXAMPLE

FIG. 39A is a plan view showing the semiconductor integrated circuit device package according to an eleventh modification example, and FIG. 39B is a sectional view taken along line 39B-39B in FIG. 39A.

As shown in FIGS. 39A, 39B, in the eleventh modification example, a nonvolatile semiconductor memory chip 8-1 and memory controller chip 8-2 are contained in the package 1. A control circuit for controlling the memory chip 8-1 is integrated in the controller chip 8-2.

The memory chip 8-1 and controller chip 8-2 may also be contained in the package 1 in this manner.

It is to be noted that it is also possible to integrate an operation circuit for processing data in the controller chip 8-2, in addition to the control circuit for controlling the memory chip 8-1.

TWELFTH MODIFICATION EXAMPLE

FIG. 40A is a plan view showing the semiconductor integrated circuit device package according to a twelfth modification example, and FIG. 40B is a sectional view taken along line 40B-40B in FIG. 40A.

As shown in FIGS. 40A, 40B, in the twelfth modification example, the memory controller chips 8-2 are stacked on the nonvolatile semiconductor memory chip 8-1.

It is also possible to stack and contain another chip on the chip in this manner.

It is to be noted that in the eleventh and twelfth modification examples, the nonvolatile semiconductor memory is constituted of the chip separate from that of the memory controller, but these can also be contained in one chip.

THIRTEENTH MODIFICATION EXAMPLE

Figure 41:
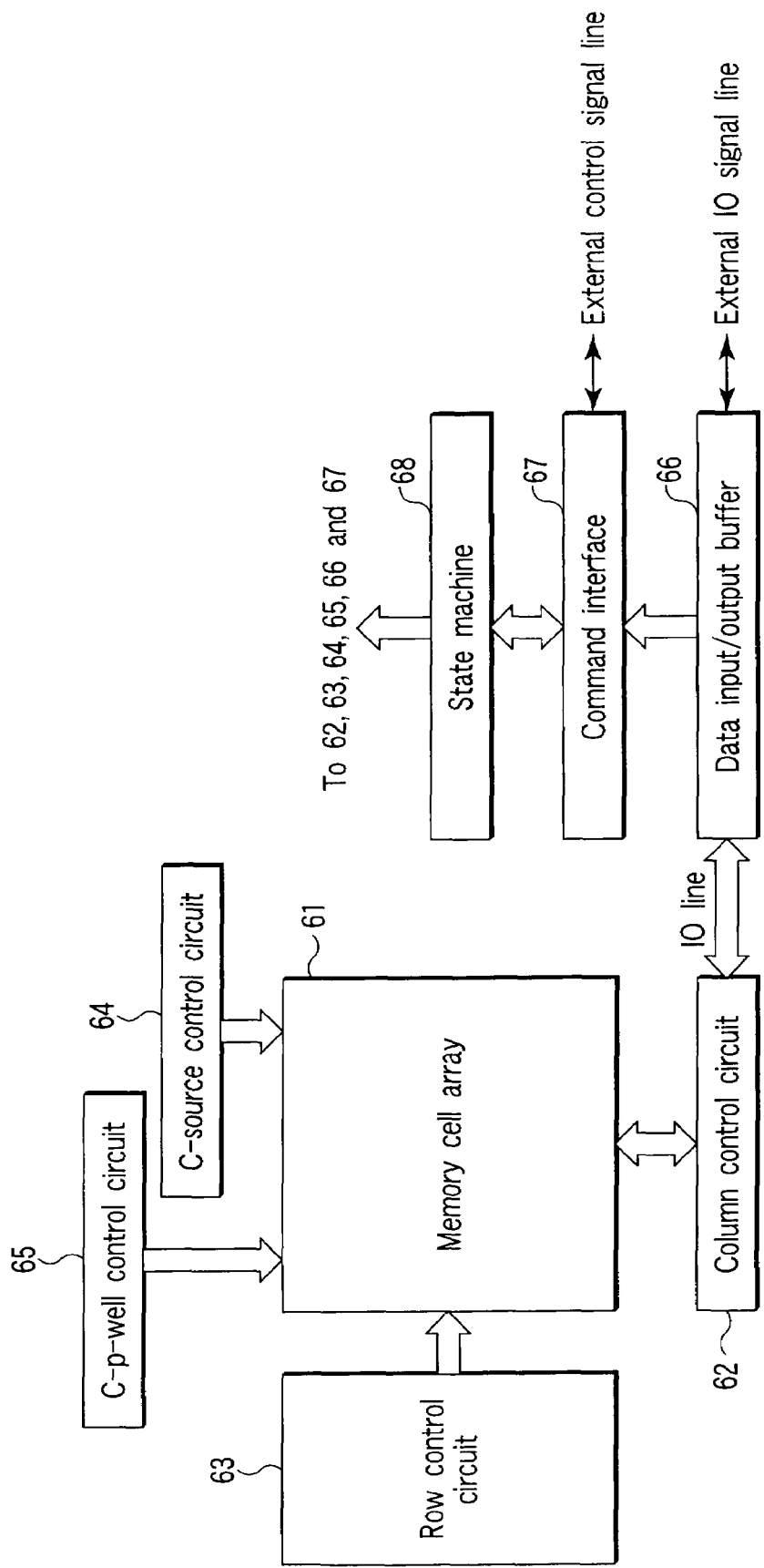
FIG. 41 is a block diagram showing one example of a semiconductor integrated circuit device according to a thirteenth modification example.

FIG. 41 is a block diagram showing one example of a semiconductor integrated circuit device according to a thirteenth modification example. It is to be noted that in the thirteenth modification example a NAND type nonvolatile semiconductor memory will be described as one example of the nonvolatile semiconductor memory, but the nonvolatile semiconductor memory other than the NAND type nonvolatile semiconductor memory may also be used.

In a memory cell array 61, nonvolatile semiconductor memory cells are arranged in a matrix form. One example of the nonvolatile semiconductor memory cell is a cell which includes a floating gate and in which data is stored in accordance with a charge accumulation amount in the floating gate.

A column control circuit 62 controls a bit line of the memory cell array 61 to delete data from memory cells, write the data into the memory cell, and read the data from the memory cell. The column control circuit 62 is disposed adjacent to the memory cell array 61.

A row control circuit 63 selects a word line of the memory cell array 61, and supplies voltages necessary for delete, write, read, write verify, and delete verify to the selected word line.

A source line control circuit (C-source control circuit) 64 controls a source line of the memory cell array 61.

A p-type well control circuit (C-p-well control circuit) 65 controls a P-type well in which the memory cell array 61 is formed.

A data input/output buffer 66 is electrically connected to the column control circuit 62 via an IO line, and electrically connected to a host (not shown) disposed outside the chip via an external IO signal line. In the data input/output buffer 66, for example, an input/output buffer circuit is disposed. The data input/output buffer 66 receives write data, outputs read data, and receives address data and command data. The data input/output buffer 66 sends the received write data to the column control circuit 62 via the IO line, or receives read data from the column control circuit 62 via the IO line. Furthermore, the buffer sends address data inputted from the outside to select an address of the memory cell array 61 to the column control circuit 62 or the row control circuit 63 via a state machine 68. The command data from the host is sent to a command interface 67.

The command interface 67 receives a control signal from the host via an external control signal line, judges whether data inputted into the data input/output buffer 66 is the write data, command data, or address data, and transfers a command signal to the state machine 68, when the data is the command signal.

The state machine 68 manages the whole flash memory. The machine receives a command from the host, and manages the read, write, write verify, delete, delete verify, and data input/output.

FIG. 42 is a diagram showing one example of the memory cell array shown in FIG. 41.

As shown in FIG. 42, the memory cell array 61 is divided into a plurality of blocks, for example, 1024 blocks BLOCK0 to BLOCK1023. The block is a minimum unit of delete. Each block BLOCKi is constituted of 4256 NAND type memory units.

In this example, each NAND type memory unit is constituted by connecting four nonvolatile semiconductor memory cells M in series. One end is connected to a bit line BL via a selection gate S connected to a selection gate line SGD, and the other end is connected to a common source line C-source via the selection gate S connected to a selection gate line SGS. Each memory cell is connected to the word line WL. The data is simultaneously written and read with respect to 4256 memory cells connected to one word line WL. The data of one bit stored in each memory cell is gathered for 4256 memory cells to constitute a minimum unit of write and read, referred to as a page.

In the nonvolatile semiconductor memory contained in the package 1, for example, a NAND type nonvolatile semiconductor memory can be used.

FOURTEENTH MODIFICATION EXAMPLE

In a fourteenth modification example, several examples of the application using the IC card according to the embodiment of the present invention will be described.

FIG. 43 is a perspective view showing one example of the electronic device in which the IC card according to the embodiment of the present invention is used. FIG. 43 shows a portable electronic device such as a digital still camera as one example of the electronic device. The IC card according to the embodiment is, for example, a memory card, and is used as recording media of the digital still camera.

As shown in FIG. 43, a card slot 72, and a circuit substrate connected to the card slot 72 are contained in a housing (case) of a digital still camera 71.

It is to be noted that the circuit substrate is omitted from FIG. 43. A memory card 70 is attached to the card slot 72 of the digital still camera 71 in an attachable/detachable state. The memory card 70 is attached to the card slot 72, and thereby electrically connected to an electronic circuit on the circuit substrate.

Figure 44:
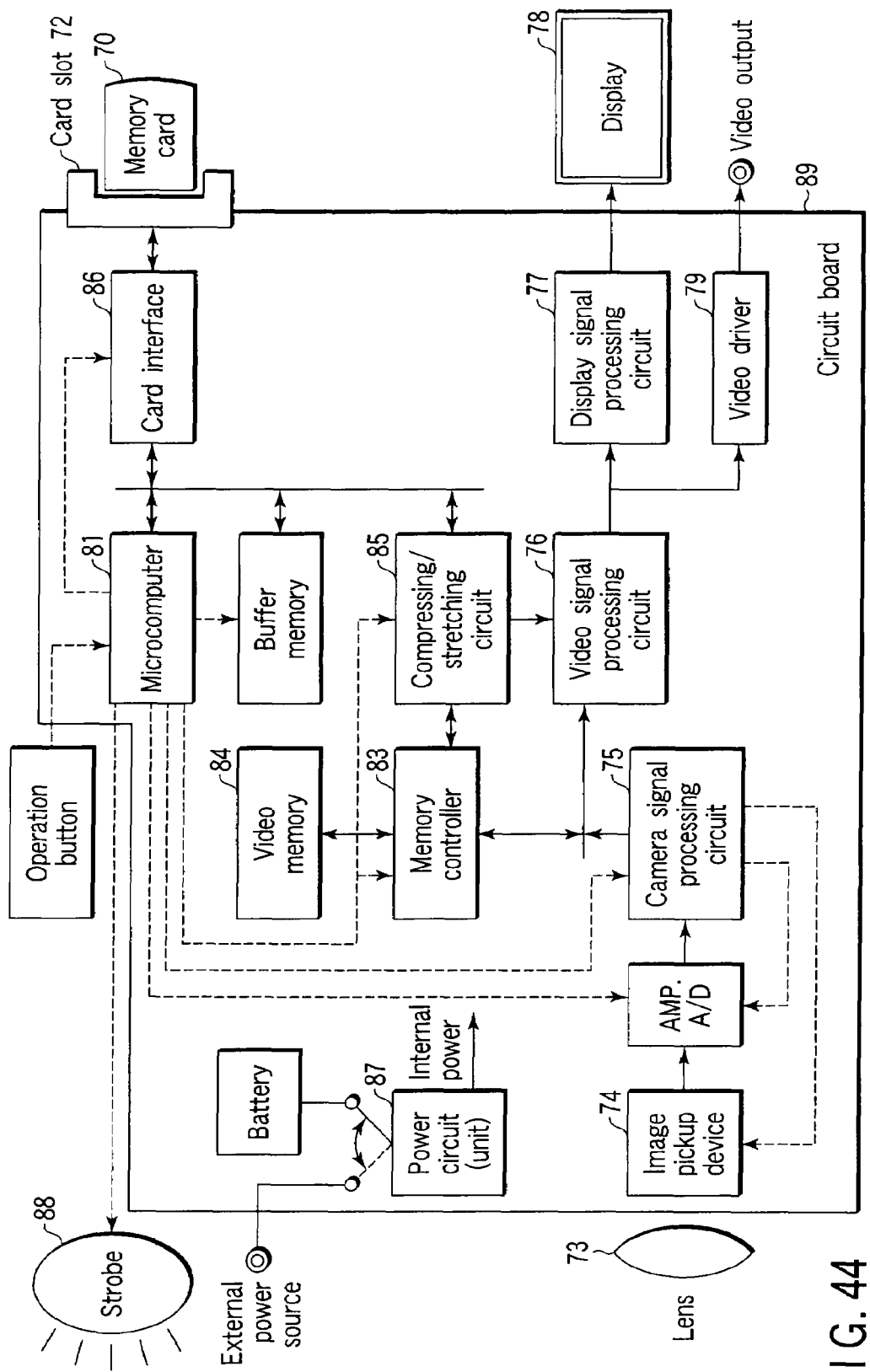
FIG. 44 is a block diagram showing a basic system of a digital still camera.

FIG. 44 is a block diagram showing a basic system of the digital still camera.

Light from a subject is condensed by a lens 73 and inputted into an image pickup device 74. The image pickup device 74 photoelectrically converts the inputted light to form, for example, an analog signal.

One example of the image pickup device 74 is a CMOS image sensor. The analog signal is amplified by an analog amplifier (AMP.), and thereafter converted to a digital signal by an A/D converter (A/D). The digitized signal is inputted into a camera signal processing circuit 75, subjected, for example, to automatic exposure control (AE), automatic white balance control (AWB), and color separation processing, and thereafter converted to a luminance signal and color difference signal.

When an image is monitored, the signal outputted from the camera signal processing circuit 75 is inputted into a video signal processing circuit 76, and converted to a video signal. Examples of a system of the video signal include a national television system committee (NTSC). The video signal is outputted into a display 78 attached to the digital still camera 71 via a display signal processing circuit 77. One example of the display 78 is a liquid crystal monitor. The video signal is outputted to a video output terminal 80 via a video driver 79. The image picked up by the digital still camera 71 can be outputted to image apparatuses such as a display of a personal computer and television via the video output terminal 80, so that the picked-up image can be enjoyed other than the display 78. The image pickup device 74, analog amplifier (AMP.), A/D converter (A/D), and camera signal processing circuit 75 are controlled by a microcomputer 81.

When the image is captured, an operation button such as a shutter button 82 is pressed. Accordingly, the microcomputer 81 controls a memory controller 83, and a signal outputted from the camera signal processing circuit 75 is written as a frame image into a video memory 84. The frame image written in the video memory 84 is compressed by a compressing/stretching circuit 85 based on a predetermined compression format, and recorded in the memory card 70 attached to the card slot 72 via a card interface 86.

When the recorded image is reproduced, the image recorded in the memory card 70 is read via the card interface 86, stretched by the compressing/stretching circuit 85, and thereafter written in the video memory 84. The written image is inputted into the video signal processing circuit 76, and reflected in the display 78 and image apparatus in the same manner as in a case in which the image is monitored.

It is to be noted that in the present basic system example, on a circuit board 89, the card slot 72, image pickup device 74, analog amplifier (AMP.), A/D converter (A/D), camera signal processing circuit 75, video signal processing circuit 76, display signal processing circuit 77, video driver 79, microcomputer 81, memory controller 83, video memory 84, compressing/stretching circuit 85, and card interface 86 are mounted. It is to be noted that the card slot 72 does not have to be mounted on the circuit board 89, and may also be connected to the circuit board 89 by a connector cable. In the present example, a power circuit 87 is further mounted on the circuit board 89. The power circuit 87 receives an external power supply, or a power supply from a battery, and generates an internal power supply for use inside the digital still camera 71. One example of the power circuit 87 is a DC-DC converter. An internal power is supplied to each circuit described above not only as an operation power supply but also as power supplies of a strobe 88 and display 78.

As described above, the IC card according to the embodiment of the present invention can be used as the portable electronic devices such as the digital still camera.

As shown in FIGS. 45A to 45L, the IC card according to the embodiment of the present invention can be used not only in the digital still camera but also in a video camera (FIG. 45A), a television (FIG. 45B), an audio/visual apparatus (FIG. 45C), an audio apparatus (FIG. 45D), a game apparatus (FIG. 45E), an electronic musical instrument (FIG. 45F), a cellular phone (FIG. 45G), a personal computer (FIG. 45H), a personal digital assistant (PDA, FIG. 45I), a voice recorder (FIG. 45J), and an electronic book terminal (FIG. 45L).

Moreover, the IC cards 70 according to the embodiment of the present invention can be used not only as the electronic apparatuses but also as removable media in the system. For example, the cards are the removable media in an electronic vote system and a point of sales (POS) system. In these systems, secrecy of information is remarkably high. There is a possibility that a trouble is caused in security in information communication using Internet. In this case, the IC card 70 according to the embodiment may be used as a transmission medium of information. The IC card 70 according to the embodiment can not only store the information but also set, for example, a cipher key using the function of IC. When the cipher key is set, an accidental access to the IC card 70 can be prevented, and it is possible to prevent accidental copy/falsification/browse/leak of the information.

Figure 45M:
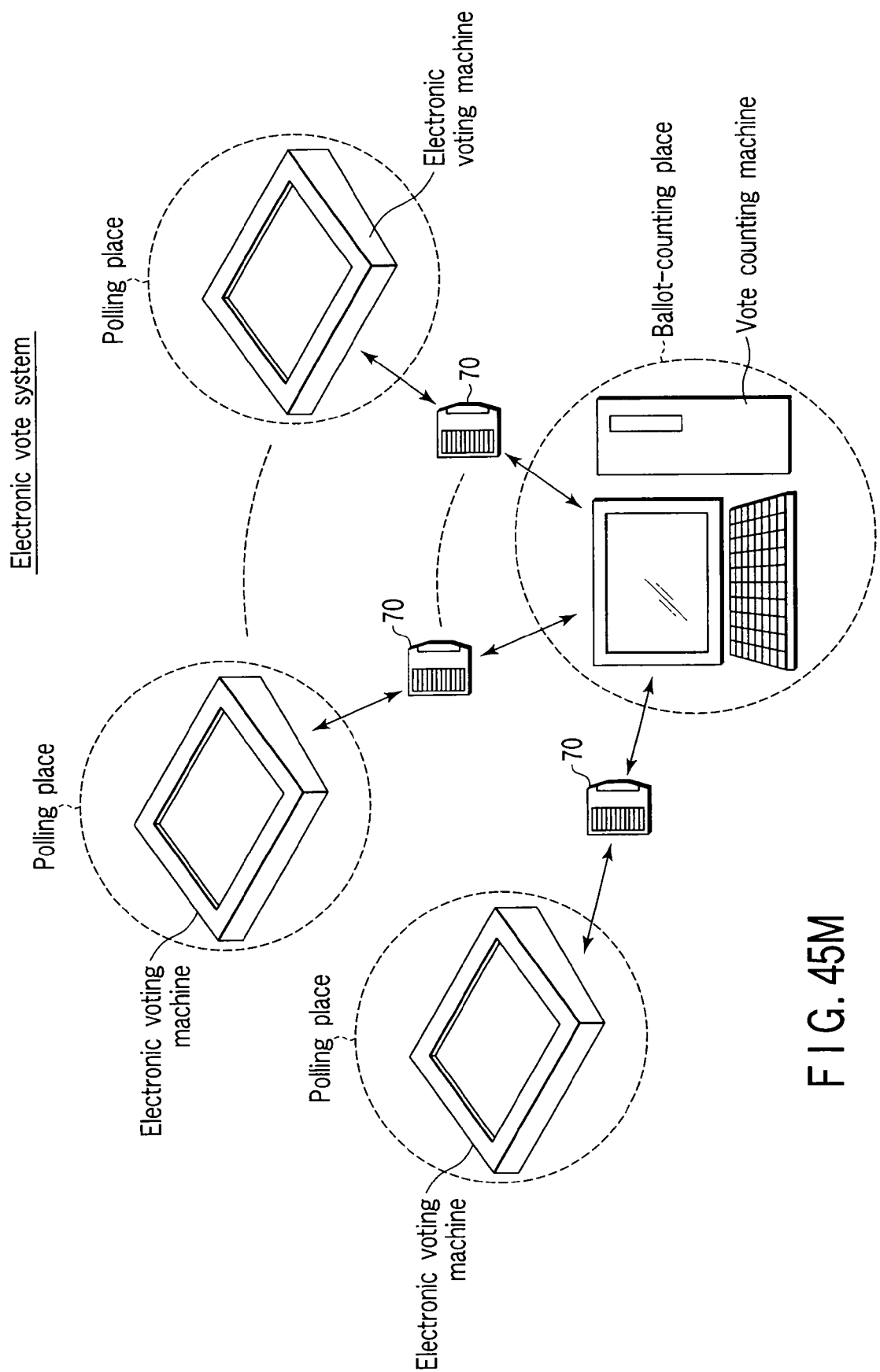
FIGS. 45A to 45N are diagrams showing another example of the electronic device or system in which the IC card according to the embodiment of the present invention is used.

FIG. 45M is a diagram showing one example of the electronic vote system. In a polling place, an electronic voting machine is installed, and each voter uses the electronic voting machine to ballot for an arbitrary candidate. Ballot results are stored in the IC card 70. The IC card 70 is transported to a ballot-counting place. In the ballot-counting place, a vote counting machine is installed, and the counting machine counts and totals the ballot results stored in the IC card 70.

FIG. 45N shows one example of the POS system. There are floor type terminals such as a POS-handling-type cash register in standing storefronts such as a shop, and there is a host computer in an information management center. Sales information, customer information, and the like inputted in the cash register are stored in the IC card 70, transported to the information management center, and inputted into the host computer. POS-handling handy terminals are prepared in movable storefronts such as a cargo collector. Cargo collection information, customer information, and the like inputted in the handy terminal are stored in the IC card 70, periodically transported to the center, and inputted in the host computer. The sales information, cargo collection information, and customer information inputted in the host computer are analyzed, and used as information sources of customer management, sales management, inventory management, and purchase management.

It is to be noted that FIG. 45N shows the POS system using both the floor type terminal and handy terminal, but it is also possible to use only the floor type terminal in the POS system, or it is also possible to use only the handy terminal in the POS system. This may appropriately be selected in consideration of a demand, business type, and management scale of a company in which the POS system is used. One example of the POS system has been described. Needless to say, the IC card 70 according to the embodiment can be used not only in the sales business but also in warehousing/shipping management and clearance management in a logistics field.

Needless to say, the IC card 70 according to the embodiment of the present invention can also be used in electronic apparatuses and systems other than the above-described electronic apparatuses and systems.

The present invention has been described above in terms of the embodiment and the first to fourteenth modification examples, but is not limited to the embodiment and the first to fourteenth modification examples, and can variously modified and carried out without departing from the scope of the present invention.

Moreover, various features disclosed in the embodiment can be carried out alone, but can of course be combined and carried out appropriately.

Furthermore, the embodiment includes various stages of the present invention. By an appropriate combination of a plurality of constituting elements disclosed in the embodiment, it is also possible to extract various stages of the present invention.

As described above, according to the embodiments of the present invention, there can be provided the IC card which can be manufactured at a low cost, the semiconductor integrated circuit device package which can be used in the IC card, and the electronic device in which the IC card is used.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general invention concept as defined by the appended claims and their equivalents.

What is claimed is:

1. An IC card, comprising:
a semiconductor integrated circuit device package having one surface and another surface opposite to the one surface, which includes a wiring board, a semiconductor integrated circuit chip on the wiring board, and an insulating resin coated over the semiconductor integrated circuit chip to form the other surface of the integrated circuit device package;
card terminals on the one surface of the semiconductor integrated circuit device package, the card terminals being electrically connected to the semiconductor integrated circuit chip, the card terminals being rectangular and extending in parallel to each other, an outermost of the card terminals being wider than the other terminals; and a base card, including a concave portion, attached to the other surface of the semiconductor integrated circuit device package, the base card including a card terminal surface and an opposite surface, wherein side walls of the semiconductor integrated circuit device package are spaced apart from the base card, and the card terminal surface of the base card includes a rib projecting from the card terminal surface on an end of the card terminal surface opposite to the apparatus insertion surface.

2. The IC card according to claim 1, wherein when the base card is placed on a plane with the card terminal surface directly downward, surfaces of the card terminals are out of contact with the plane.

3. The IC card according to claim 2, wherein the surfaces of the card terminals are positioned lower than the card terminal surface of the base card.

4. The IC card according to claim 1, wherein a chamfered portion is disposed in a corner in which a side surface of the concave portion of the base card intersects with the card terminal surface of the base card.

5. The IC card according to claim 1, wherein a stepped portion is provided on a bottom of the concave portion of the base card.

6. The IC card according to claim 1, wherein at least one semiconductor integrated circuit chip provided in the semiconductor integrated circuit device package includes a non-volatile semiconductor memory chip.

7. The IC card according to claim 1, wherein at least one semiconductor integrated circuit chip provided in the semiconductor integrated circuit device package includes a non-volatile semiconductor memory chip and a memory controller chip.

* * * * *